United States Patent
Stevens

(10) Patent No.: US 7,444,623 B2
(45) Date of Patent: *Oct. 28, 2008

(54) PROCESS AND APPARATUS FOR ADJUSTING TRACES

(75) Inventor: Mac Stevens, San Jose, CA (US)

(73) Assignee: FormFactor, Inc., Livermore, CA (US)

( * ) Notice: Subject to any disclaimer, the term of this patent is extended or adjusted under 35 U.S.C. 154(b) by 424 days.

This patent is subject to a terminal disclaimer.

(21) Appl. No.: 11/070,075

(22) Filed: Mar. 1, 2005

(65) Prior Publication Data

US 2005/0148243 A1 Jul. 7, 2005

Related U.S. Application Data

(63) Continuation of application No. 09/938,895, filed on Aug. 24, 2001, now Pat. No. 6,862,727.

(51) Int. Cl.
*G06F 9/44* (2006.01)
*G06F 9/45* (2006.01)

(52) U.S. Cl. .................. 717/128; 717/127; 717/129; 717/132; 717/140

(58) Field of Classification Search .............. 717/100, 717/124–128, 129, 132, 140, 12; 716/12–14
See application file for complete search history.

(56) References Cited

U.S. PATENT DOCUMENTS

| | | | |
|---|---|---|---|
| 4,500,963 A | 2/1985 | Smith et al. | |
| 4,642,890 A | 2/1987 | Hechtman et al. | |
| 5,245,550 A | 9/1993 | Miki et al. | |
| 5,557,797 A * | 9/1996 | Yano ...................... | 717/128 |
| 5,592,600 A | 1/1997 | De Pauw et al. | |
| 5,636,129 A | 6/1997 | Her | |
| 5,657,242 A | 8/1997 | Sekiyama et al. | |
| 5,717,600 A | 2/1998 | Ishizuka | |
| 5,842,017 A * | 11/1998 | Hookway et al. ........... | 717/158 |
| 5,862,381 A | 1/1999 | Advani et al. | |
| 5,926,176 A | 7/1999 | McMillan et al. | |
| 5,948,113 A | 9/1999 | Johnson et al. | |
| 5,956,512 A | 9/1999 | Simmons et al. | |
| 6,014,507 A | 1/2000 | Fujii | |
| 6,077,311 A | 6/2000 | Lichtenstein et al. | |
| 6,256,769 B1 | 7/2001 | Tamarkin et al. | |
| 6,275,956 B1 | 8/2001 | On et al. | |
| 6,317,869 B1 | 11/2001 | Adl-Tabatabai et al. | |
| 6,349,403 B1 | 2/2002 | Dutta et al. | |

(Continued)

OTHER PUBLICATIONS

Goering, "Altium Preps Topological Autorouter," EEdesign (Dec. 10, 2001), 3 pages.

(Continued)

*Primary Examiner*—Wei Y. Zhen
*Assistant Examiner*—Qamrun Nahar
(74) *Attorney, Agent, or Firm*—N. Kenneth Burraston

(57) ABSTRACT

Traces routed through a computer depiction of a routing area of a system, such as an electronics system, comprise a plurality of connected nodes. The traces may be smoothed, straightened, or otherwise adjusted (e.g., to correct design rule violations) by assigning forces to the nodes and moving the nodes in accordance with the nodes. The forces may be based on such things as the proximity of the nodes to each other and to obstacles in the routing area.

30 Claims, 21 Drawing Sheets

U.S. PATENT DOCUMENTS

| | | | |
|---|---|---|---|
| 6,349,406 B1 * | 2/2002 | Levine et al. | 717/128 |
| 6,385,758 B1 | 5/2002 | Kikuchi et al. | |
| 6,490,713 B2 | 12/2002 | Matsumoto | |
| 6,507,805 B1 * | 1/2003 | Gordon et al. | 702/186 |
| 6,546,548 B1 * | 4/2003 | Berry et al. | 717/128 |
| 6,553,565 B2 | 4/2003 | Click et al. | |
| 6,665,852 B2 | 12/2003 | Xing et al. | |
| 6,678,876 B2 | 1/2004 | Stevens et al. | |
| 6,738,961 B2 * | 5/2004 | Snider | 716/16 |
| 6,748,583 B2 * | 6/2004 | Aizenbud-Reshef et al. | 717/127 |
| 6,862,727 B2 | 3/2005 | Stevens | |
| 6,957,422 B2 * | 10/2005 | Hunt | 717/130 |
| 7,178,134 B2 * | 2/2007 | Groeschel | 717/128 |
| 7,200,588 B1 * | 4/2007 | Srivastava et al. | 707/3 |
| 2004/0088670 A1 | 5/2004 | Stevens et al. | |

OTHER PUBLICATIONS

CLAN Systems Ltd. PCB AutoRouter, 5 pages.

Hingston et al., "Topological Autorouting, Mapping the changing space," Altium Limited (2002), pp. 1-8.

"Single-layer automatic router," IBM Research, 3 pages.

Xing et al, "A minimum cost path search algorithm through tile onstacles," ACM ISPD Apr. 2001, pp. 192-197.

Macii et al, "Combing wire swapping and spacing for low power deep submission buses," ACM GLSVLSI, Apr. 2003, pp. 198-202.

Dion, "Fast printed circuit board routing," ACM/IEEE Design Automation Conf., 1987, pp. 727-734.

\* cited by examiner

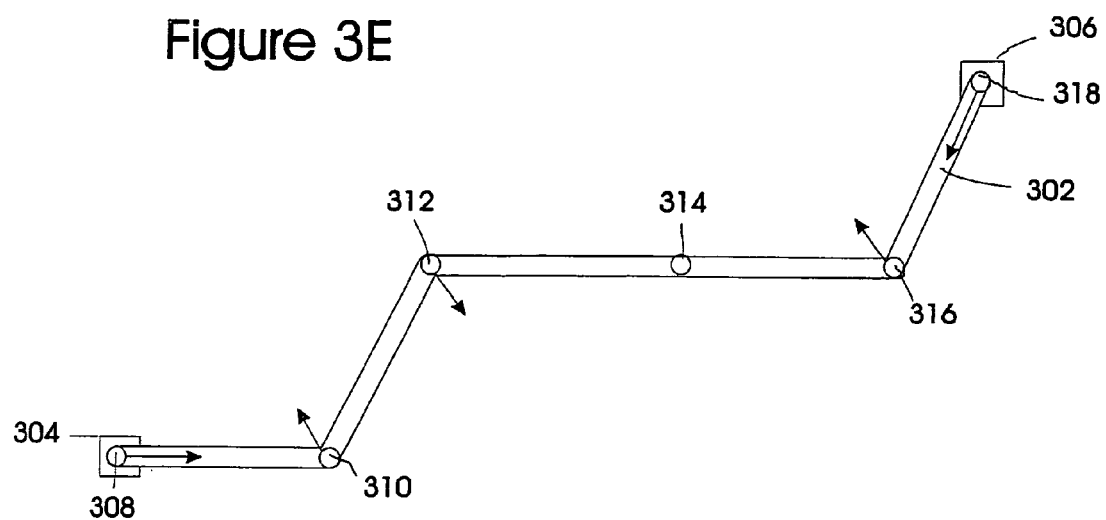
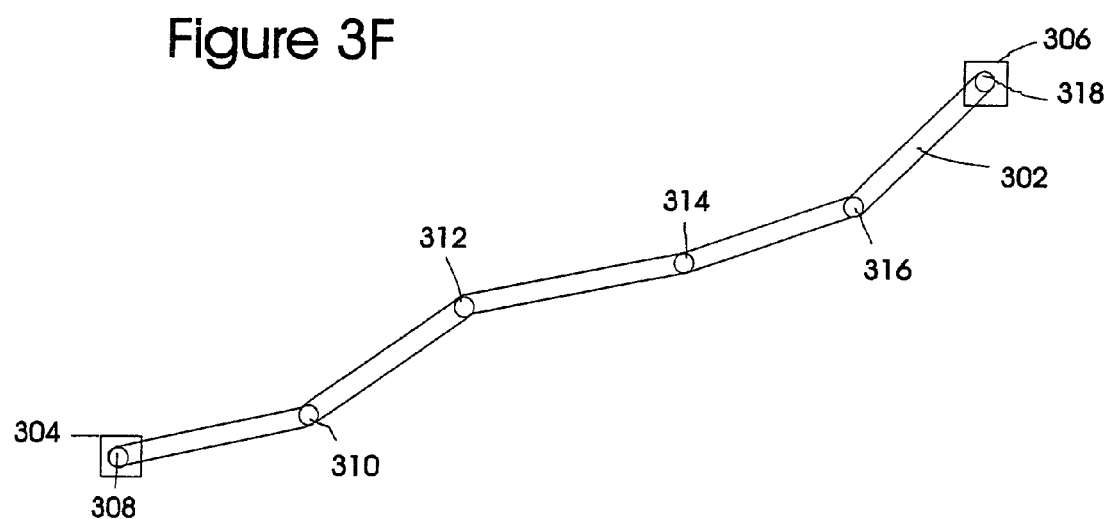

PROCESS AND APPARATUS FOR ADJUSTING TRACES

CROSS-REFERENCE TO RELATED APPLICATIONS

This application is a continuation of U.S. patent application Ser. No. 09/938,895, which issued as U.S. Pat. No. 6,862,727 on Mar. 1, 2005.

FIELD OF THE INVENTION

The present invention is directed to adjusting computer depictions of traces routed through a routing space of a system, such as an electronics system.

BACKGROUND OF THE INVENTION

A typical electronics apparatus or system includes a plurality of components and electrical traces interconnecting the components. (The term "components" is used herein broadly to include any electrical circuit element (including without limitation integrated circuits, discrete circuit elements, and elements of an integrated circuit), any portion of such an electrical circuit element, and any electrically conductive element (including without limitation, electrically conductive vias, terminals, pads, etc.).) Examples of such electronic apparatuses or systems include, but are not limited to, printed circuit boards with electronic components mounted or formed thereon, probe cards for testing integrated circuits formed into a semiconductor wafer, and integrated electronic circuits, to name just a few.

A printed circuit board, for example, generally includes components such as integrated circuits, discrete electronics components, connectors for making electrical connections onto and off of the printed circuit board, vias, terminals, pads, etc. mounted or formed thereon. Electrical traces or wires must be formed on or within the printed circuit board to electrically connect various ones of the components.

Generally speaking, a probe card includes a printed circuit board, which is often circular. Components on the printed circuit board of a probe card may include such things as contacts for making electrical connections with a tester and contacts for making electrical connections with a probe head that ultimately makes electrical connections with test points on a semiconductor wafer. The printed circuit board may additionally include other components such as integrated circuits and discrete electronic components. Electrical traces must be formed on the printed circuit board to interconnect the tester contacts, the probe head contacts, and the other electrical components.

Again generally speaking, an integrated circuit consists of numerous electrical components integrated into a semiconductor material. Typically, the electrical components are transistors but may also include other electronic elements. The transistors and other electronic elements must be interconnected by traces of metal or other conductive materials formed typically in layers as part of the integrated circuit.

Regardless of the type of electronics apparatus or system (three nonexclusive examples of which have been mentioned above), the apparatus or system must be designed before it can be manufactured. Due to the increasing complexity of such electronic apparatuses and systems, computer aided engineering (CAE) or computer aided design (CAD) computer products have been developed to aid the design of such apparatuses or systems. For example, such computer products may aid in the selection and arrangement of the electronic and mechanical components that compose the electronic apparatus or system. Some CAE or CAD computer products also aid in creating paths through the apparatus or system for the electrical traces that interconnect the electrical components of the apparatus or system. The present invention is directed to an improved computer product for adjusting paths.

SUMMARY OF THE INVENTION

The present invention is directed to adjusting computer depictions of traces routed through a routing space of a system, such as an electronics system. The traces comprise a plurality of connected nodes. Forces are assigned to the nodes, and the nodes are moved in accordance with the forces. The forces may be based on such things as the proximity of the nodes to each other and to obstacles in the routing area. This tends to smooth, straighten and/or shorten the traces, and may also tend to correct design rule violations.

BRIEF DESCRIPTION OF THE DRAWINGS

FIGS. 3A-3F illustrate exemplary application of forces to nodes of a trace.

DETAILED DESCRIPTION OF EMBODIMENTS OF THE INVENTION

The present invention is directed to adjusting computer depictions of traces routed through a routing space of a system, such as an electronics system. The following specification describes exemplary embodiments and applications of the invention. The invention, however, is not limited to these exemplary embodiments and applications or to the manner in which the exemplary embodiments and applications operate or are described herein.

As used herein, "electronics system" refers to any product, apparatus, or system (or portion thereof) that comprises a plurality of interconnected electronic components. As mentioned above, nonexclusive examples of such electronics "systems" include a printed circuit board with electronics mounted thereto, a probe card, and an integrated circuit. In all such systems, conductive traces or wiring (hereinafter referred to as "traces") must be formed to interconnect the various electronic components. Usually, the traces may not overlap and must be formed a minimum distance from each other and other system obstacles. Depending on the particular electronics system, it may be advantageous for such traces to be as short as possible or of uniform length. Such electronics system typically include obstacles, zones, or areas through which the traces may not be routed. Such obstacles are referred to herein as "obstacles."

Figure 1:
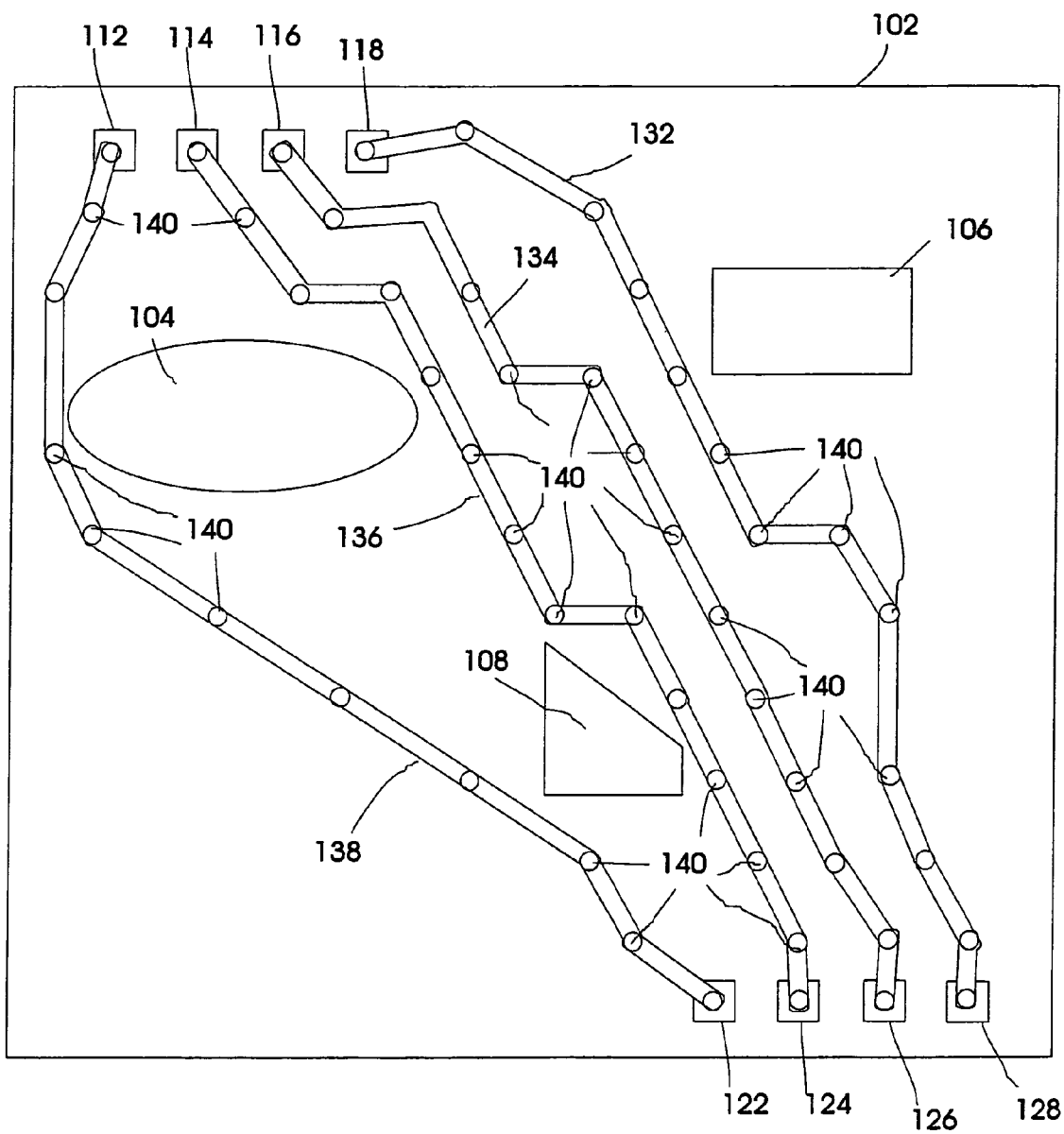
FIG. 1 illustrates an exemplary routing space with routed traces.

FIG. 1 depicts a computer rendered depiction of an exemplary routing area 102 in an electronics system (not shown). The exemplary routing area 102 includes electronic components 112, 114, 116, 118, 122, 124, 126, 128 and obstacles 104, 106, 108. Electrically conductive traces 138, 136, 134, 132 connect component 112 to component 122, component 114 to component 124, component 116 to component 126, and component 118 to component 128. As shown, the traces 132, 134, 136, 138 comprise a plurality of interconnected nodes 140. Although the nodes are illustrated in FIG. 1 as circles for clarity, the nodes are preferably treated as points (e.g., the centers of the circles). Throughout the discussions in this specification, nodes will be treated as points (e.g., at the center of a circle), even though the nodes are depicted as circles for clarity in the drawings.

Many methods of generating computer depicted traces, such as traces 132, 134, 136, 138, are known to those of ordinary skill in the field, and the traces 132, 134, 136, 138 may have been generated by any such method. For example, the traces may have, been created using a linked graph as disclosed in U.S. patent application Ser. No. 09/938,789 (now U.S. Pat. No. 6,678,876), with an attorney docket number P156-US, entitled "Process And Apparatus For Finding Paths Through A Routing Space," and filed concurrently with the instant application, which application is incorporated by reference herein in its entirety. Alternatively, the traces may have been created using other automated or semiautomatic methods for creating such traces. Of course, the traces may have been created manually. As another example, the traces could consist of a simple straight line routing of traces between interconnected components without regard to trace crossovers, obstacles, or design rules requirements.

As mentioned above, nonexclusive examples of electronics systems include printed circuit boards with electronics mounted thereon, probe cards, and integrated circuits. Thus, the routing area 102 may represent all or a portion of a printed circuit board, a probe card, or an integrated circuit. Obstacles 104, 106, 108 represent areas through which the traces may not pass. It should be apparent that the routing area 102 need not be square or rectangular but may be any shape. Indeed, probe cards are typically circular, in which case, the routing area of a probe card may also be circular. The components 112, 114, 116, 118, 122, 124, 126, 128 may be treated as obstacles.

Figure 2:
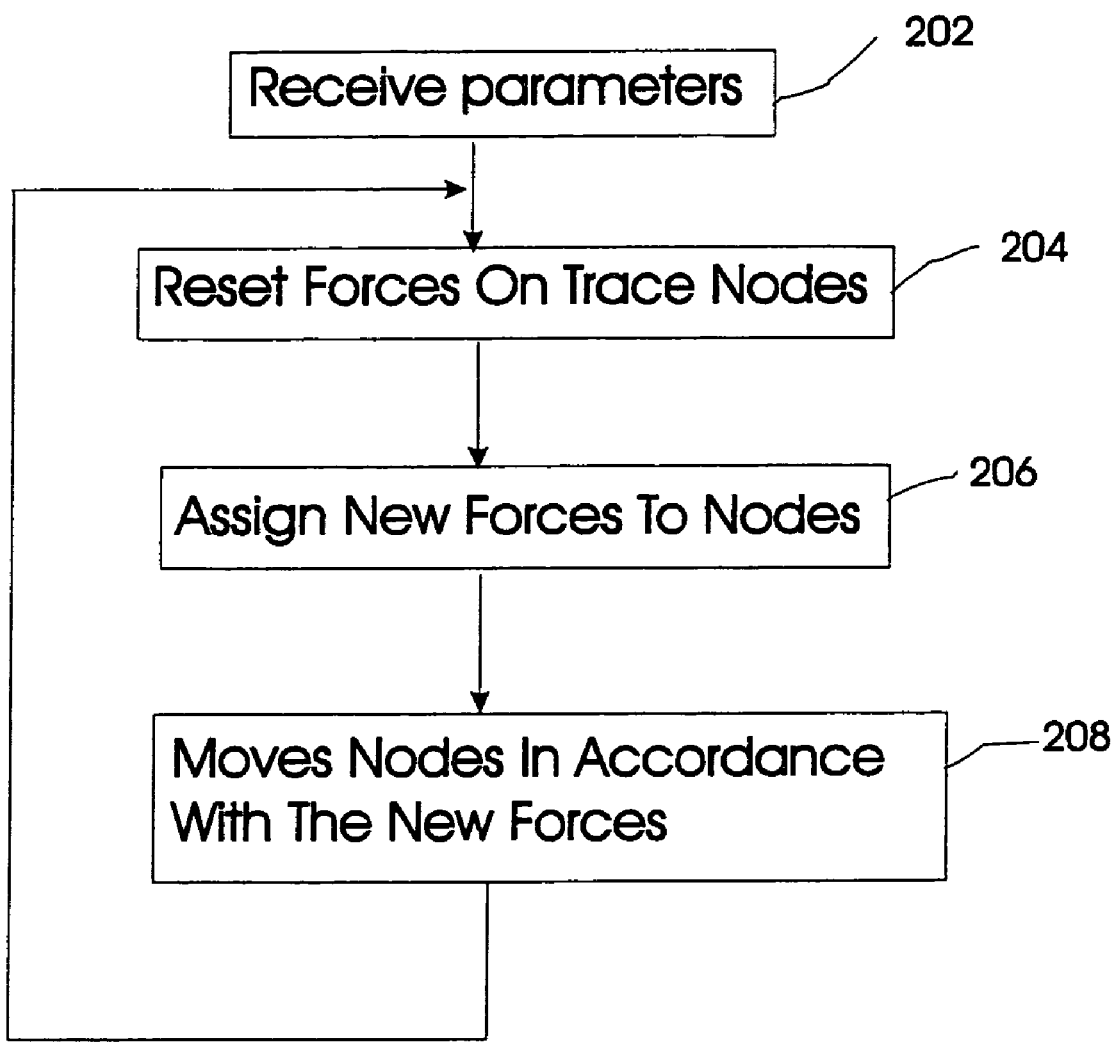
FIG. 2 illustrates an exemplary embodiment of the invention.

The present invention optimizes computer depicted traces in an electronics system, such as traces 132, 134, 136, 138. FIG. 2 illustrates an exemplary embodiment of the invention. As shown, parameters are initially received 202. The parameters are in computer readable form and define such things as the routing area, obstacles in the routing area, components in the routing area, and the traces, including the nodes that define the traces. The parameters may also include other data such as design rules for the traces. Design rules may include such things as the minimum and maximum permissible width of a trace, the minimum distance between traces (i.e., the minimum trace-to-trace clearance), the minimum distance between traces and obstacles (i.e., the minimum trace-to-obstacle clearance), and other such data.

The process illustrated in FIG. 2 optimizes the traces by assigning forces to nodes that compose the traces and then moving the nodes in accordance with the forces. The forces are applied to attempt to shorten, smooth, and or straighten the traces, and/or to attempt to cause the traces to adhere to applicable design rules. As shown in FIG. 2, once the parameters are received 202, the process of FIG. 2 resets the forces applied to the nodes 204, assigns new forces to the nodes 206, and moves the nodes in accordance with the forces 208. As suggested by the arrow leading from step 208 to step 204, the steps of resetting the forces 204, assigning new forces 206, and moving the nodes in accordance with the new forces 208 may be repeated one or more times.

Although not shown in FIG. 2, those of ordinary skill in the field will readily recognize the need to include provisions within the process illustrated in FIG. 2 to control the number of times steps 204, 206, and 208 are repeated, and such persons will be able to readily implement such provisions. For example, the steps 204, 206, 208 could simply be repeated a predetermined number of times. As another example, the process of FIG. 2 could be configured to break out of the loop of steps 204, 206, 208 upon receipt of an external command, such as an interrupt generated by a human user, a timer, or some other means. As yet another example, the process could be repeated until all traces pass a design rule check. (Design rule checkers are known in the field but are not discussed herein because, although they may be used with this invention, they do not constitute a necessary part of this invention.)

Figure 3A:
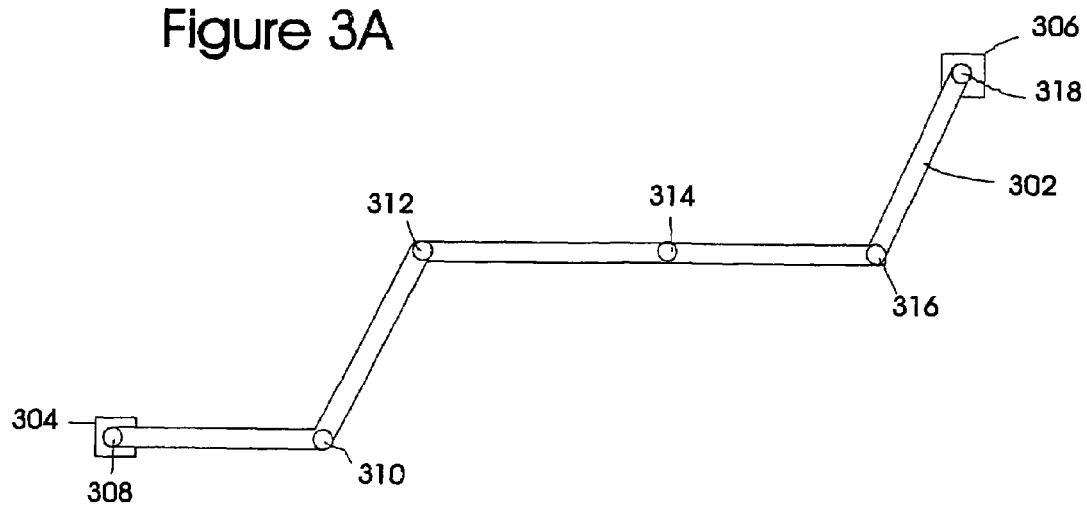

There are a number of ways in which new forces may be assigned to the nodes that compose the traces 206. FIGS. 3A-3F illustrate a simplified example of one such way. FIG. 3A depicts a trace 302 routed between components 304 and 306. The trace is defined by nodes 308, 310, 312, 314, 316, 318. As will be seen, forces are applied to sequential pairs of nodes along the trace 302 to attempt to smooth, straighten, and/or shorten the trace. In the example illustrated in FIGS. 3A-3F, the forces tend to draw the node pairs towards each other.

Figure 3B:
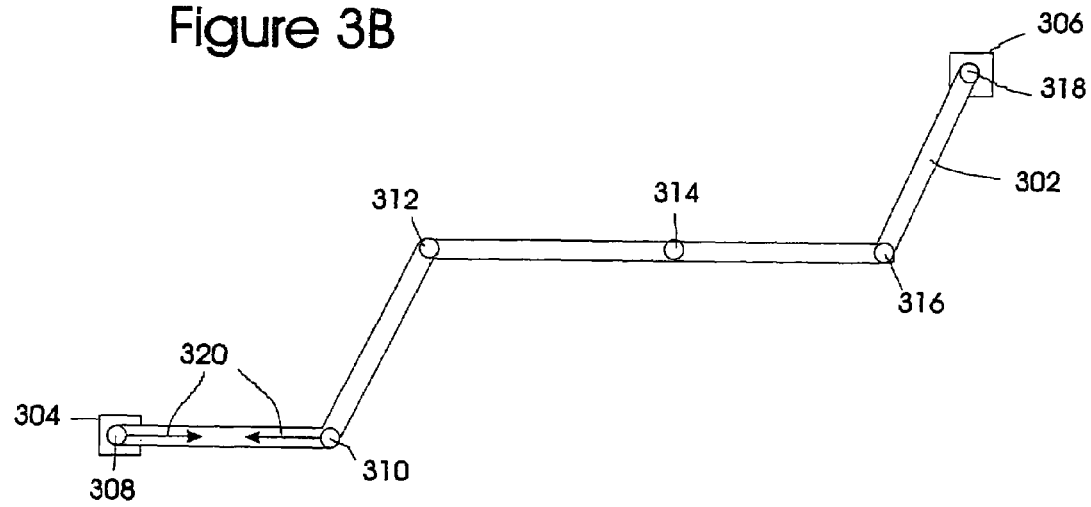
Figure 3C:
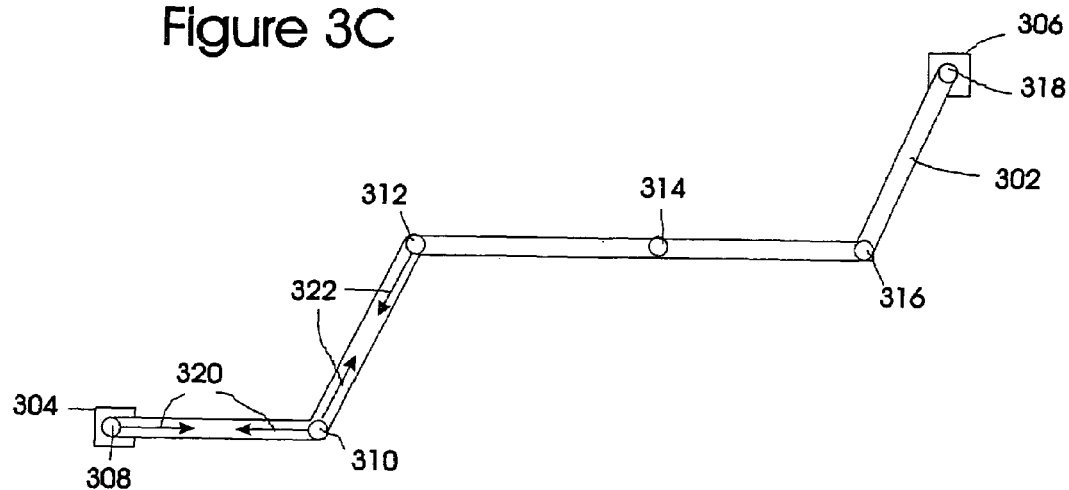

Starting from node 308 and moving in the direction of node 318, the first sequential node pair consists of nodes 308 and 310. As shown in FIG. 3B, forces 320 are assigned to each of these nodes, tending to draw the nodes together. The next sequential pair of nodes are nodes 310 and 312. As shown in FIG. 3C, forces 322 are assigned to these nodes, again tending to draw the nodes together. This process of assigning forces to adjacent node pairs tending to draw the nodes together is continued, until forces 320, 322, 324, 326, 328 are assigned to the nodes along trace 302 as shown in FIG. 3D.

Figure 3D:
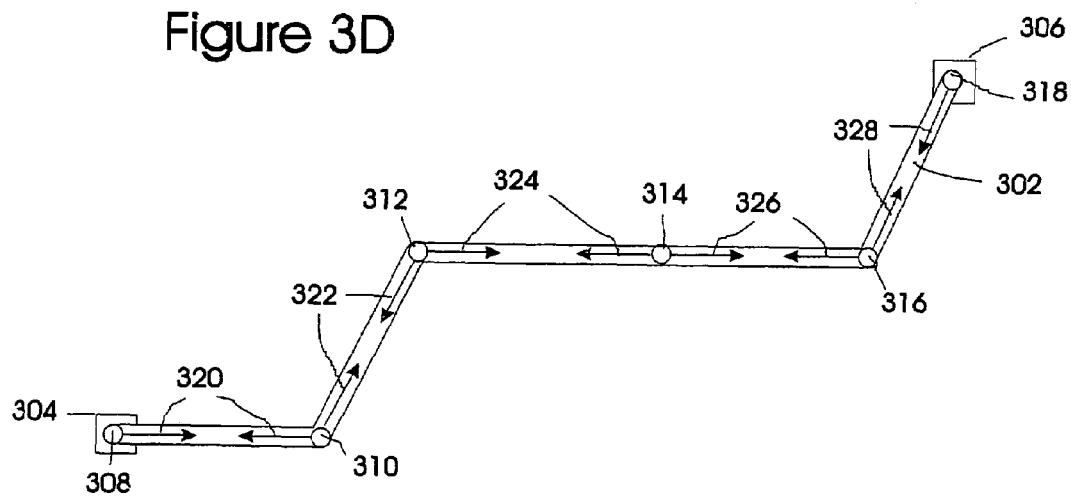

As can be seen in FIG. 3D, each node except the end nodes 308 and 318 includes two forces, one force pulling the node toward is nearest neighbor on one side and the other force pulling it toward its nearest neighbor on the other side. In accordance with the principles of vector arithmetic, these two forces on each node form a single sum or resultant force, as shown in FIG. 3E. The sum or resultant force on a particular node, if not zero, will pull the node in a particular direction with a particular force magnitude. For example, as shown in FIG. 3E, a resulting force sum on node 310 tends to pull it up and to the left, the resulting force sum on node 312 tends to pull it down and to the right, and the resulting force sum on node 316 tends to pull it up and to the left. Note that the sum of the forces assigned to 314 resulted in a net force of zero.

Referring again to FIG. 2, once the forces are assigned to the nodes at step 206, the nodes are moved in accordance with the forces at step 208. As shown in FIG. 3F, nodes 310, 312, and 316 are moved in the direction of the resultant force on those nodes and a distance corresponding to the magnitude of the resultant force. Node 314 was not moved because the resultant force on it was zero. End nodes 308, 318 were not moved because, typically, the trace cannot be moved away from the components the trace electrically connects. To prevent the end nodes 308, 318 from moving, they are flagged as being immovable nodes. Thus, regardless of the forces applied to end nodes, they are not be moved. Of course, there may be applications in which it may be advantageous to allow one or more of the end modes to move. In such a case, provisions may be made for allowing one or both end nodes to move.

As can be seen from FIG. 3F, the trace 302 is smoother, straighter, and shorter than the trace as shown in FIG. 3A. As mentioned above, the process of resetting the forces on the nodes 204, assigning new forces to the nodes 206, and moving the nodes in accordance with the new forces can be repeated as necessary or desired. Eventually, the exemplary trace 302 depicted in FIGS. 3A-3F should become a straight line between end points 308 and 318 or should at least approximate a straight line.

The magnitude of the forces assigned to nodes should be selected so as to move nodes specified distances. That is, the magnitude of the forces assigned to a node is preferably defined in terms of the distance within the routing space that the force would move the node, and such a distance may, in turn, be defined in terms of one or more design rules. A magnitude for the type of force assigned to adjacent nodes in a trace (e.g., the type of forces illustrated in FIGS. 3A-3F) selected from the following range is suitable: a force magnitude that would cause a node to move (if the force acts by itself) a distance selected from between about $1/20$ to about $1/5$ the sum of the maximum trace width plus the minimum trace-to-trace clearance. The instant invention, however, is not limited to use of a force magnitude selected from the foregoing range.

Of course, the magnitude of the forces assigned to the nodes need not be fixed but may vary in some way. For example, the magnitude of the forces assigned to the nodes may vary with respect to the distance between the sequential node pairs. As another example, the magnitude of the forces assigned to the nodes may vary with time as the process of FIG. 2 is executed. That is, for example, each time the step 206 of assigning new forces to nodes is repeated, the magnitude of the forces assigned to the nodes may change.

Moreover, although the force assigned to one node of a pair of adjacent nodes in the example illustrated in FIG. 3D is in the direction of the other node in the pair, the forces may be assigned other directions. As one example, repelling force—rather than the attractive forces described above that tend to draw the sequential node pairs—may be assigned to a sequential node pair if the nodes are too close to each other, that is, within a threshold distance of each other. Of course, the force assigned to one node in a sequential pair may be directed away from the other node in the pair at some angle. An example of this is to determine a straight line between non-adjacent nodes of the same trace, and pull the intervening nodes towards the line.

Another exemplary way of assigning forces to the nodes of a trace (step 206 of FIG. 2) is illustrated in FIGS. 4A-4C and 5A-5E. In these examples, nodes of a trace that lie over or within a specified distance of an obstacle are assigned forces that tend to move the nodes off of and/or away from the obstacle.

Figure 4A:
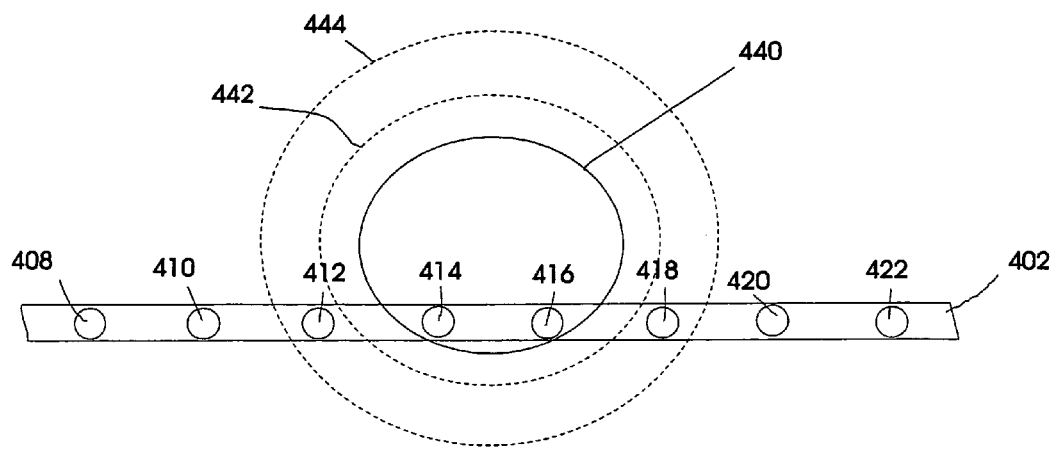
FIGS. 4A-4C illustrate exemplary application of forces to nodes of a trace.

Illustrated in FIG. 4A is an exemplary obstacle 440 and a portion of a trace 402, which includes nodes 408 through 422. As shown in FIG. 4A, there are two zones defined around the obstacle 440: a first zone 442, and a second zone 444. The first zone 442 defines a space immediately surrounding obstacle 440. The first zone defines an area through which no trace may pass; typically this space corresponds to the minimum obstacle-to-trace clearance received at step 202 of FIG. 2. The second zone 444 defines a space immediately surrounding the first zone 442. It should be noted that the invention is not limited to use of two zones as illustrated in FIG. 4A. Only one zone may be used around an object, or more than two zones may be used. That is, only the first zone 442 may be used, or additional zones may be defined around the second zone 444.

Regardless of the number of zones defined around the obstacle 440, a force is assigned to each zone. Generally speaking, the magnitude of each force is chosen so as move a node a given distance within the routing space. Selection of specific force magnitudes and directions is not critical to the invention, and any set of force magnitudes and directions may be assigned to the zone or zones surrounding an object. Typically, the directions of the forces will be away from the obstacle. Preferably, the magnitude of the force assigned to the first zone 442 is greater than the magnitude of the attractive forces assigned to adjacent nodes in the same trace, as discussed above with respect to FIGS. 3A-3F. A magnitude for a force assigned to the first zone 442 selected from the following range is suitable: a force magnitude that would cause a node to move (if the force acts by itself) a distance selected from between about $1/8$ to about $1/2$ the sum of the maximum trace width plus the minimum trace-to-trace clearance. The instant invention, however, is not limited to use of a force magnitude selected from the foregoing range.

Alternatively, the magnitude of the force assigned to the first zone 442 may be defined as being sufficient to move a node all or some fraction of the width of the first zone 442. Thus, for example, if the force is sized to move a node the entire width of zone 442, all nodes falling within zone 442 would be moved out of the zone after one application of forces to the nodes (ignoring other forces that might be applied to the nodes). On the other hand, if the force is sized to move a node half the width of zone 442, a node falling within zone 442 may or may not be moved out of the zone after one application of forces to the nodes, but all such nodes would be moved out of the zone after two application of forces to the nodes (again ignoring other forces that might be applied to the nodes).

One force magnitude may be assigned to a node regardless of its location within a zone. Alternatively, the magnitude of a force assigned to a node may vary depending on the location of the node with in a zone. For example, a node falling in first zone 442 but near the border with second zone 444 in FIG. 4B may be assigned a force with less magnitude than a node that also falls in first zone 442 but is located near the obstacle 440.

Similar considerations to those described above may be utilized to assign a force to the second zone 444. In the above example, however, a trace passing through the second zone 444 does not violate design rules. Consequently, the magnitude of the forces assigned to the second zone 444 are usually smaller than the magnitude of the forces assigned to the first zone 442. In fact, in a preferred embodiment, the magnitude of the forces assigned to the second zone 444 are also smaller than the size of the attractive forces assigned to adjacent nodes in a trace (e.g., the type of forces described above with respect to FIGS. 3A-3F).

It should be apparent that the direction of a force may be determined in any of many different ways. For example, with a circular object such as the exemplary obstacle 440 illustrated in FIG. 4A, all forces may be in a direction that begins at the center of the obstacle and passes through the node to which the force is applied. For other shaped obstacles, forces may likewise emanate in a direction beginning at the center of the obstacle, or alternatively, at the centroid of the obstacle. Many other possibilities exist. For example, as will be discussed below with respect to FIGS. 5A-5E, forces may be directed perpendicular to an edge of a polygon-shaped obstacle and/or the forces may be in a direction that bisects an angle formed by a corner of the polygon. Alternatively, the forces may be directed at a specified angle to an edge of a polygon-shaped obstacle. These and other schemes for fixing the direction of forces assigned to nodes may be implemented with the present invention.

Figure 4B:
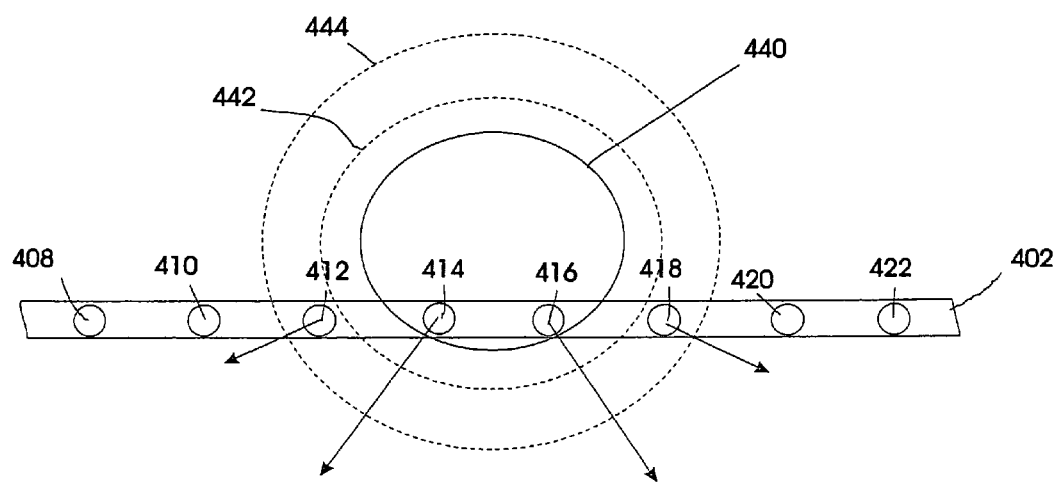

Referring again to the trace 402 in FIG. 4A, it can be seen that nodes 414 and 416 actually overlay the obstacle and therefore are within the first zone 442. Nodes 412 and 418 fall within the second zone 444, and nodes 408, 410, 420, and 422 do not fall within either the first or second zones. Accordingly, as shown in FIG. 4B, a relatively large force is assigned to nodes 414 and 416, smaller forces are assigned to nodes 412 and 418, and no forces are assigned to nodes 408, 410, 420, or 422. As also shown, in the example illustrated in FIG. 4B, the direction of each of the forces is away from the obstacle along a line originating from the center of the obstacle 444 and passing through the node to which the force is assigned. As mentioned above, this is but one of many possible schemes for assigning directions to the forces.

Figure 4C:
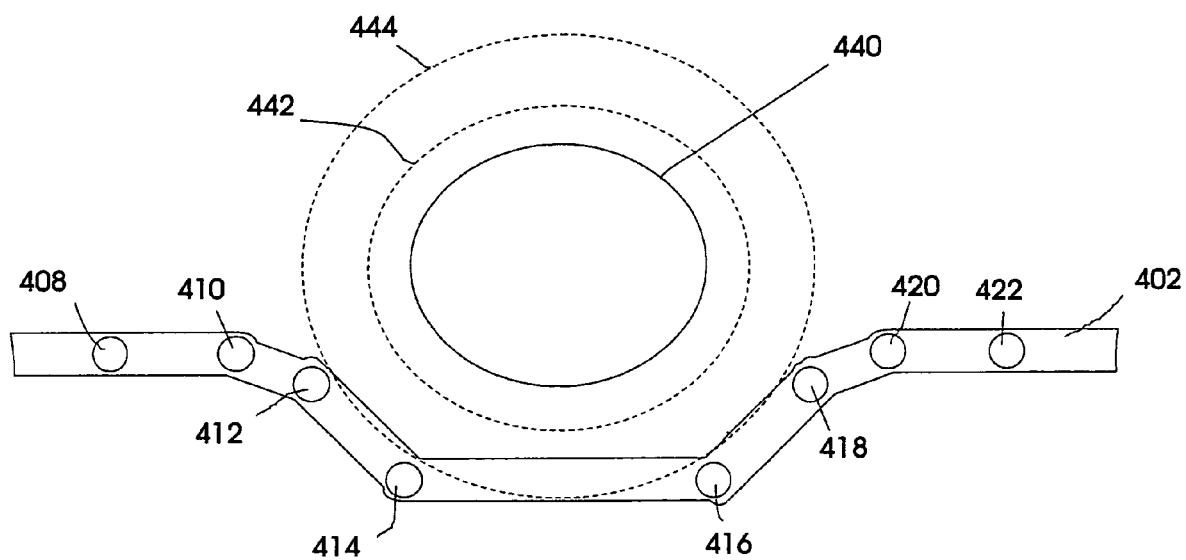

As shown in FIG. 4C, the nodes are then moved in accordance with the forces applied to the nodes. As shown, nodes 408, 410, 420, and 422 do not move because no force was applied to them. Nodes 412 and 418 move a relatively short distance, and nodes 414 and 416 move a relatively longer distance, as stronger forces were applied to them.

FIGS. 5A-5E illustrate a similar example in which forces are assigned to the trace nodes due to their proximity to an obstacle 540. As with the example illustrated in FIG. 4A, two zones are associated with the obstacle 540: a first zone 542, and a second zone 544. As with the example illustrated in FIG. 4A, nodes overlaying the obstacle or falling within the first zone 542 are assigned a relatively strong force while nodes falling within the second zone are assigned a weaker force.

Figure 5A:
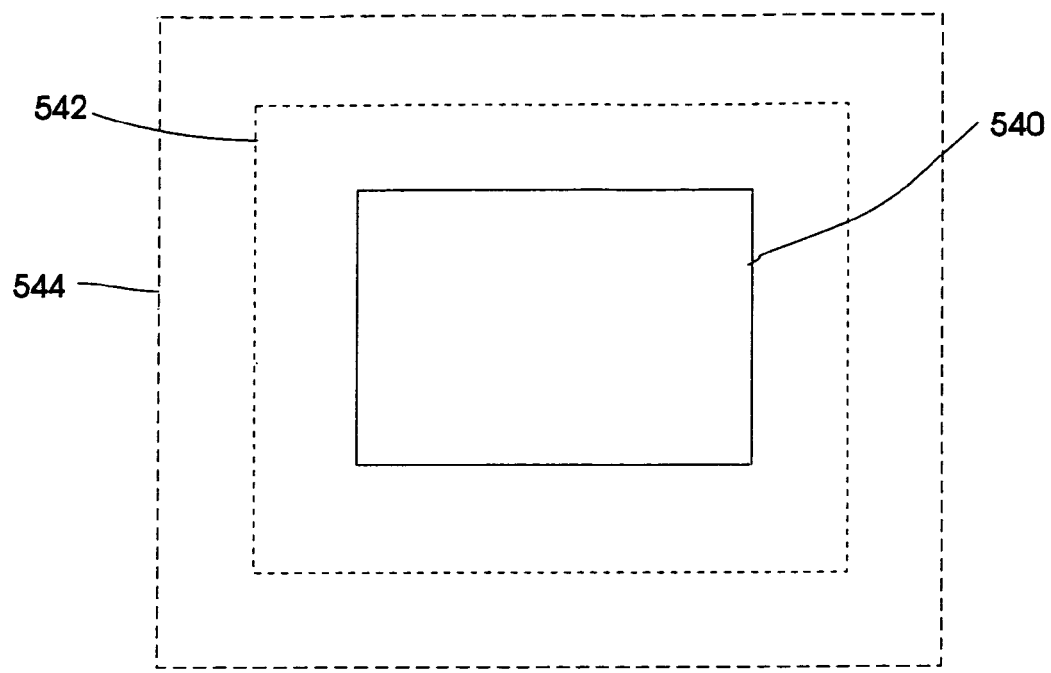
FIGS. 5A-5E illustrate exemplary application of forces to nodes of a trace.
Figure 5B:
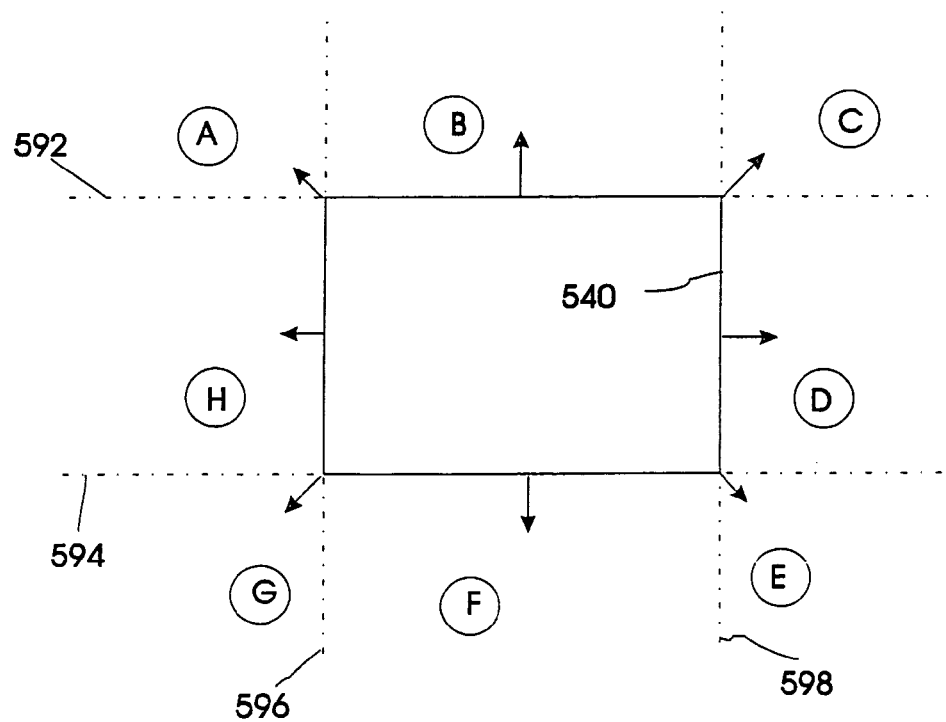

FIG. 5B illustrates on example of how the directions of the forces may be determined. Imaginary lines 592, 594, 596, 598 that are collinear with the sides of obstacle 540 (that is, each of lines 592, 594, 596, 598 is perpendicular to a side of obstacle 540 and also passes through at least one corner of the obstacle 540) define eight areas: A, B, C, D, E, F, G, and H. As shown in FIG. 5B, the direction of a force applied to a node that falls within areas B, D, F, or H is in a direction away from the obstacle and perpendicular to a corresponding side of the obstacle 540, and the direction of a force applied to a node that falls within areas A, C, E, or G is in a direction away from the obstacle 540 and in a direction defined by a ray or line starting at a corresponding corner of the obstacle and passing through the node to which the force is applied. Alternatively, the closest point from the node to the obstacle 540 may be found, and if the closest point on the obstacle lies along a side of the obstacle, the force applied to the node may be directed perpendicularly from the side of the obstacle through the node. If, on the other hand, the closest point on the obstacle to the node is a corner of the obstacle 540, the force applied to the node may be directed radially from the corner through the node.

Figure 5C:
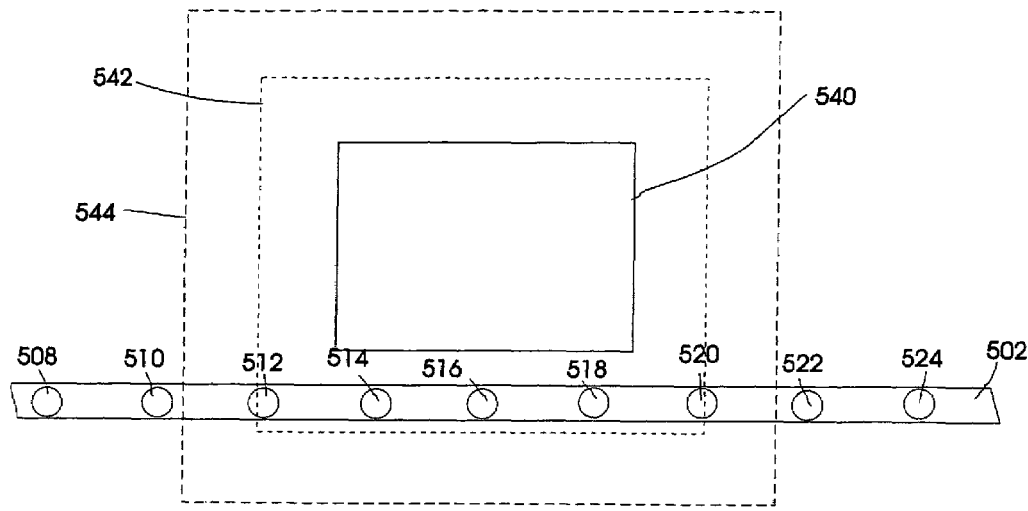
Figure 5D:
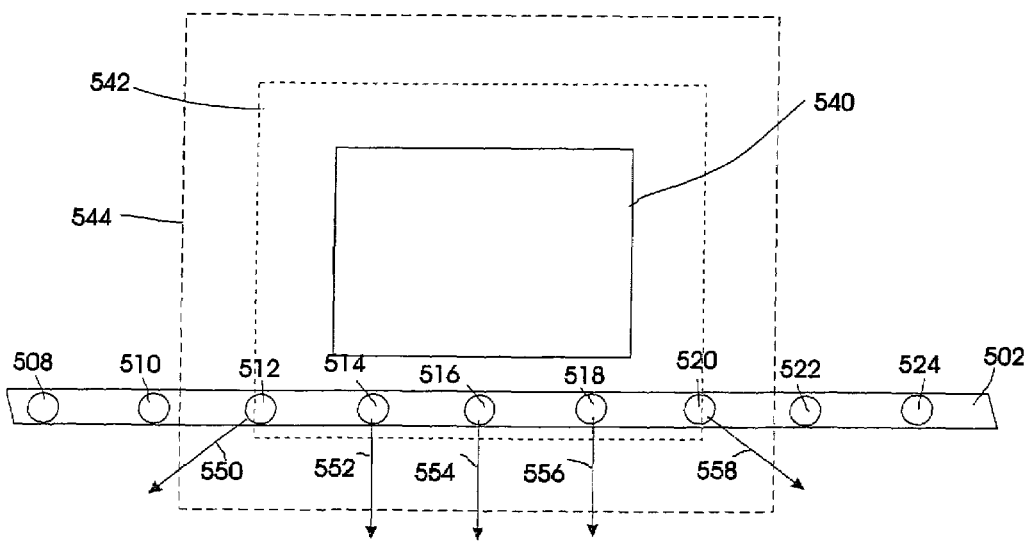

As shown in FIG. 5C, nodes 512, 514, 516, 518, and 520 fall at least partially within the first zone 542, no nodes fall within the second zone 544, and nodes 508, 510, 522, and 524 do not fall within either the first or the second zones. (It should be noted that, if the nodes are treated as points (e.g., located at the center of the circles depicting the nodes in FIG. 5C), the nodes either fall in or out of a zone. In this example, it is assumed that, if the nodes 512 and 520 are treated as points, both nodes fall within the first zone 542.) Consequently, as shown in FIG. 5D, forces are assigned to nodes 512, 514, 516, 518, and 520, but no forces are assigned to nodes 508, 510, 522, or 524. As can be seen from FIG. 5D, nodes 514, 516, and 518 fall within what is labeled area F in FIG. 5B. The forces 552, 554, 556 applied to these nodes are therefore directed away from the obstacle 540 and perpendicular to the edge of the obstacle that corresponds to area F. Nodes 512 and 520, on the other hand fall in what are labeled areas G and E in FIG. 5B. Accordingly, the forces 550,558 applied to these nodes are directed away from the obstacle 540 in a direction along a line that begins with a corresponding corner of the obstacle and passes through the node to which the force is assigned, as shown in FIG. 5D.

Figure 5E:
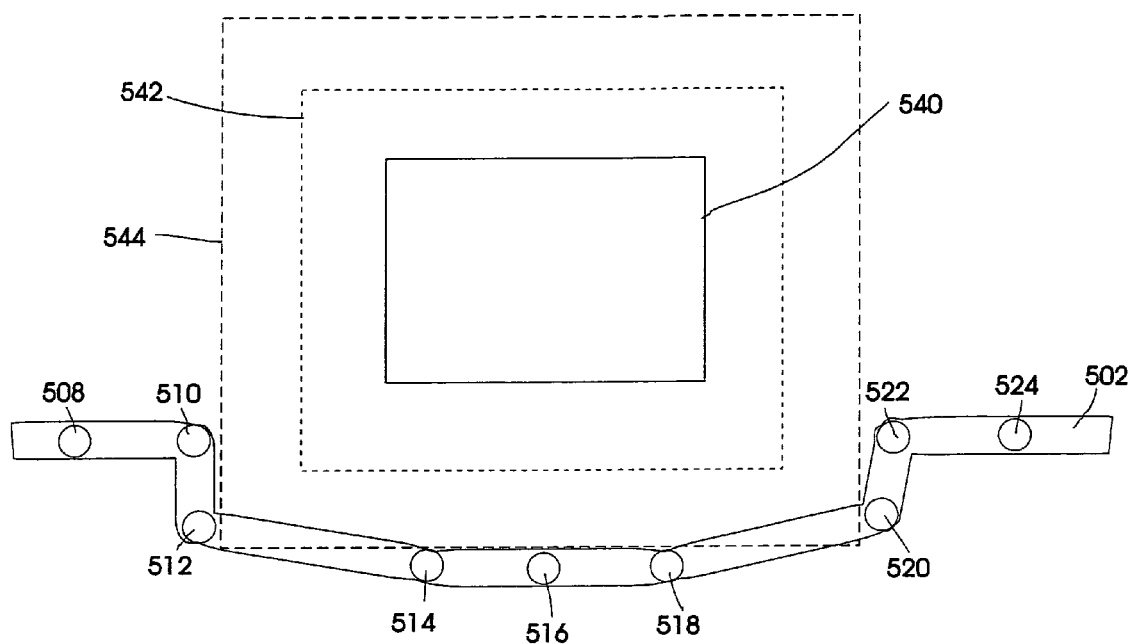

As shown in FIG. 5E, the nodes are then moved in accordance with the forces applied to the nodes. As shown, nodes 508, 510, 522, and 524 do not move because no forces were applied to them. Nodes 512, 514, 516, 518, and 520, on the other hand, move in accordance with the forces applied to them as shown in FIG. 5E.

Although not shown in FIGS. 4A-4C or 5A-5E, forces may be applied to nodes in the direction of the obstacle rather than away from the obstacle. For example, an inner zone may be defined overlaying a portion of the obstacle or encompassing the obstacle and a portion of the first zone, and a node falling within such an inner zone may be assigned a strong force in the direction of the obstacle designed to cause the trace of which the nodes are a part to cross over the obstacle and pass along an opposite side of the obstacle from the trace's original position with respect to the obstacle.

Rather than or in addition to defining an inner zone that causes a node to cross over an obstacle as described above, the maximum number of traces that may pass between a pair of obstacles may be determined. For example, as discussed in detail in the above-identified U.S. patent application Ser. No. 09/938,789 (now U.S. Pat. No. 6,678,876), with an attorney docket number P156-US, entitled "Process And Apparatus For Finding Paths Through A Routing Space," and filed concurrently with the instant application, the length of a shortest or approximately shortest line segment between the two obstacles is determined, and then, using the minimum trace-to-obstacle clearance, minimum trace-to-trace clearance, and maximum trace width clearance received at step 202 of FIG. 2, the number of traces that may pass between the obstacles is determined. If the number of traces that have been routed between the obstacles exceeds the number of traces that may fit between the obstacles, forces may be applied to nodes of one or more of the traces routed between the obstacles that tend to push the trace or traces to the other side of one of the obstacles.

Another example in which it may be desirable to push a trace across an obstacle arises when the obstacle corresponds to an end of another trace. In such a case, nodes of all traces near the obstacle other than the trace whose end corresponds to the obstacle (the "connected trace") may be pushed in a direction that tends to move the traces toward and past the end of the connected trace (e.g., across and past the obstacle that corresponds to the connected trace's end).

FIGS. 6A-6D illustrate yet another exemplary way of assigning forces to the nodes of a trace (step 206 of FIG. 2). In this example, nodes of two traces that lie too close to each other (e.g., the nodes are in portions of the traces that are closer to each other than the minimum trace-to-trace clearance) are assigned forces that tend to move the nodes in each trace away from each other.

Figure 6A:
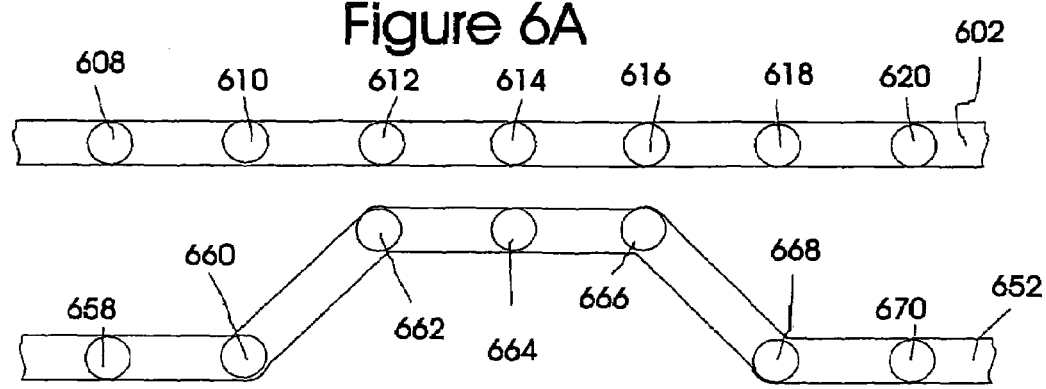
FIGS. 6A-6D illustrate exemplary application of forces to nodes of a trace.
Figure 6B:
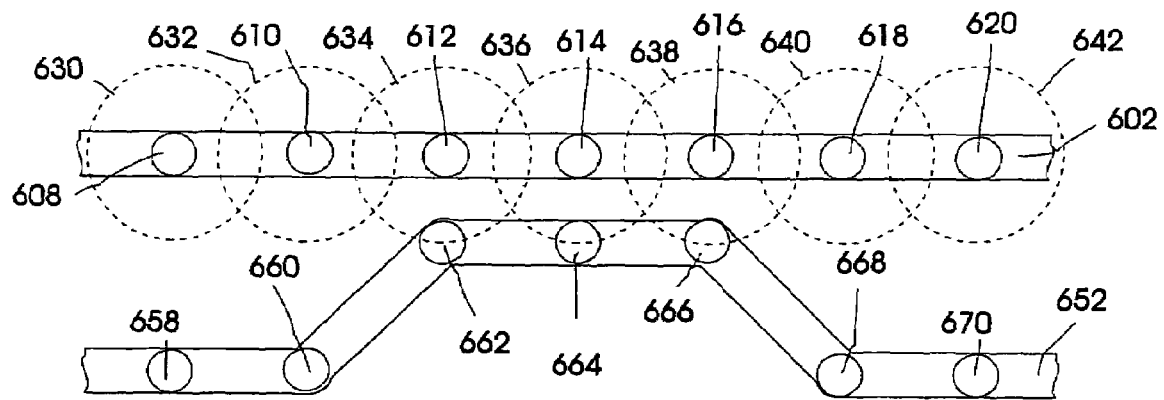
Figure 6C:
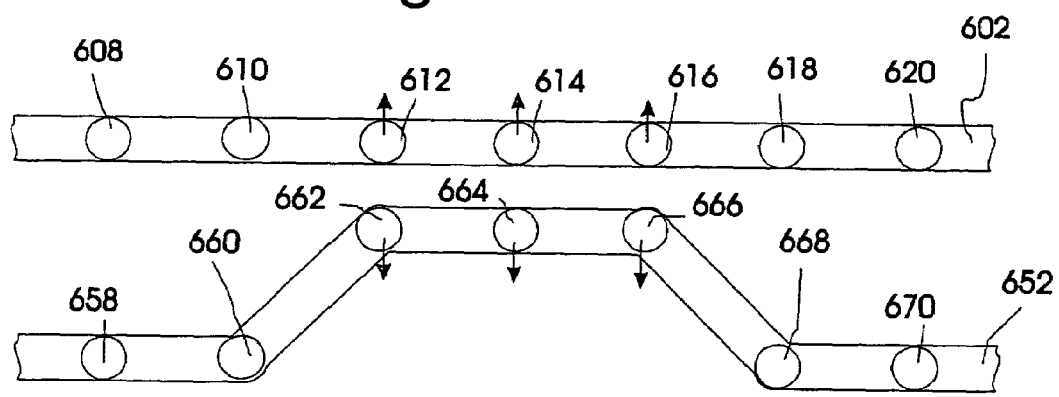

FIG. 6A illustrates portions of two exemplary traces 602 and 652. Nodes 608, 610, 612, 614, 616, 618, and 620 compose trace 602, and nodes 658, 660, 662, 664, 666, 668, and 670 compose trace 652. In FIG. 6B, imaginary circles 630, 632, 634, 636, 638, 640, and 642 define a minimum separation of their corresponding nodes from other nodes on other traces. This minimum separation may be equal to the sum of the minimum trace-to-trace clearance plus half the maximum trace width received at step 202 of FIG. 2, or it may be equal to a different distance, for example the above sum plus a safety margin. As can be seen in FIG. 6B, nodes 662, 664, and 666 in trace 652 are too close to nodes 612, 614, and 616 of trace 602. Therefore, as shown in FIG. 6C, forces are assigned to the following node pairs that tend to separate the nodes in the pair: 612 and 662, 614 and 664, and 616 and 666. Alternatively, forces may be applied to only one node in each pair.

The magnitude of the forces is preferably sufficient to move each node only a fraction of the minimum trace-to-trace clearance. Although the process of FIG. 2 may need to be repeated multiple times in order to move the two traces apart sufficiently to comply with the minimum required trace-to-trace clearance, the smaller the distance moved with each pass through FIG. 2, the less the process is likely to push the traces beyond the minimum required trace-to-trace clearance. A magnitude for the type of force assigned to separate traces that are too close together (e.g., the type of forces illustrated in FIGS. 6A-6D) selected from the following range is suitable: a magnitude that would cause a node to move (if the force acts by itself) a distance selected from between about ½ to about ⅛ the sum of the maximum trace width plus the minimum trace-to-trace clearance. The instant invention, however, is not limited to use of a force magnitude selected from the foregoing range. Moreover, the forces assigned to nodes in different traces deemed to be too close may be a constant magnitude that does not vary regardless of the distance between the nodes. Alternatively, the magnitude of the forces may vary with the distance between the node pairs in the different traces. For example, the closer the nodes in different traces are to each other, the greater the forces applied to each node. As another example, the magnitude of the force may vary (e.g., be increased) over time as the process of FIG. 2 executes.

It should be noted that, although the use of imaginary circles is illustrated in FIG. 6B for searching for nodes in other traces that are too close to a particular node, there are alternative ways of performing such a search. For example, one such way is to divide the routing space into contiguous areas, such as squares or rectangles. To search for nearby nodes that are too close to a particular node, all nodes falling within the same area as the particular node or all nodes falling within the same area as the particular node as well as areas that are contiguous with the particular node's area can be tested to determine if they are too close to the particular node. Another way of finding nodes that are too close to a trace is, with respect to that trace, simply to search for nodes that are too close to the trace itself (rather than to close to the nodes of the trace). These as well as other ways of searching for nearby nodes that are too close to a particular node may be used with the invention.

Figure 6D:
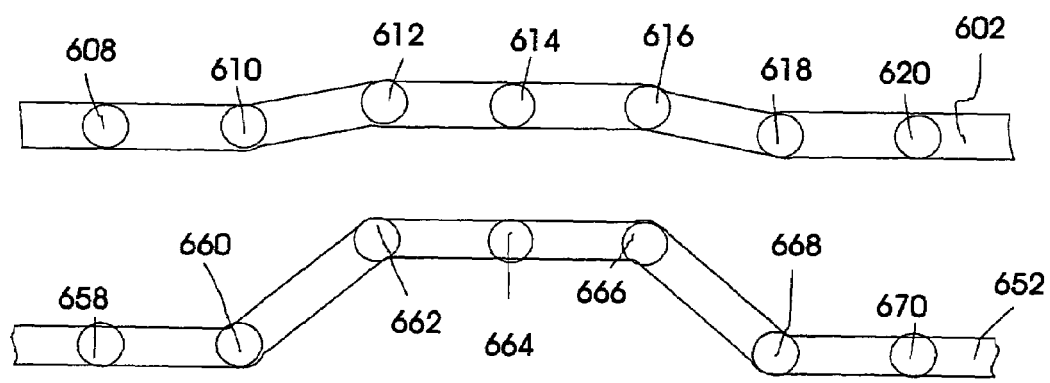

As shown in FIG. 6D, once the forces are assigned to the nodes, the nodes are moved in accordance with the forces applied to the nodes. As shown, all six of the nodes to which a force was applied were moved, causing portions of traces 602 and 652 to move away from each other.

Figure 7:
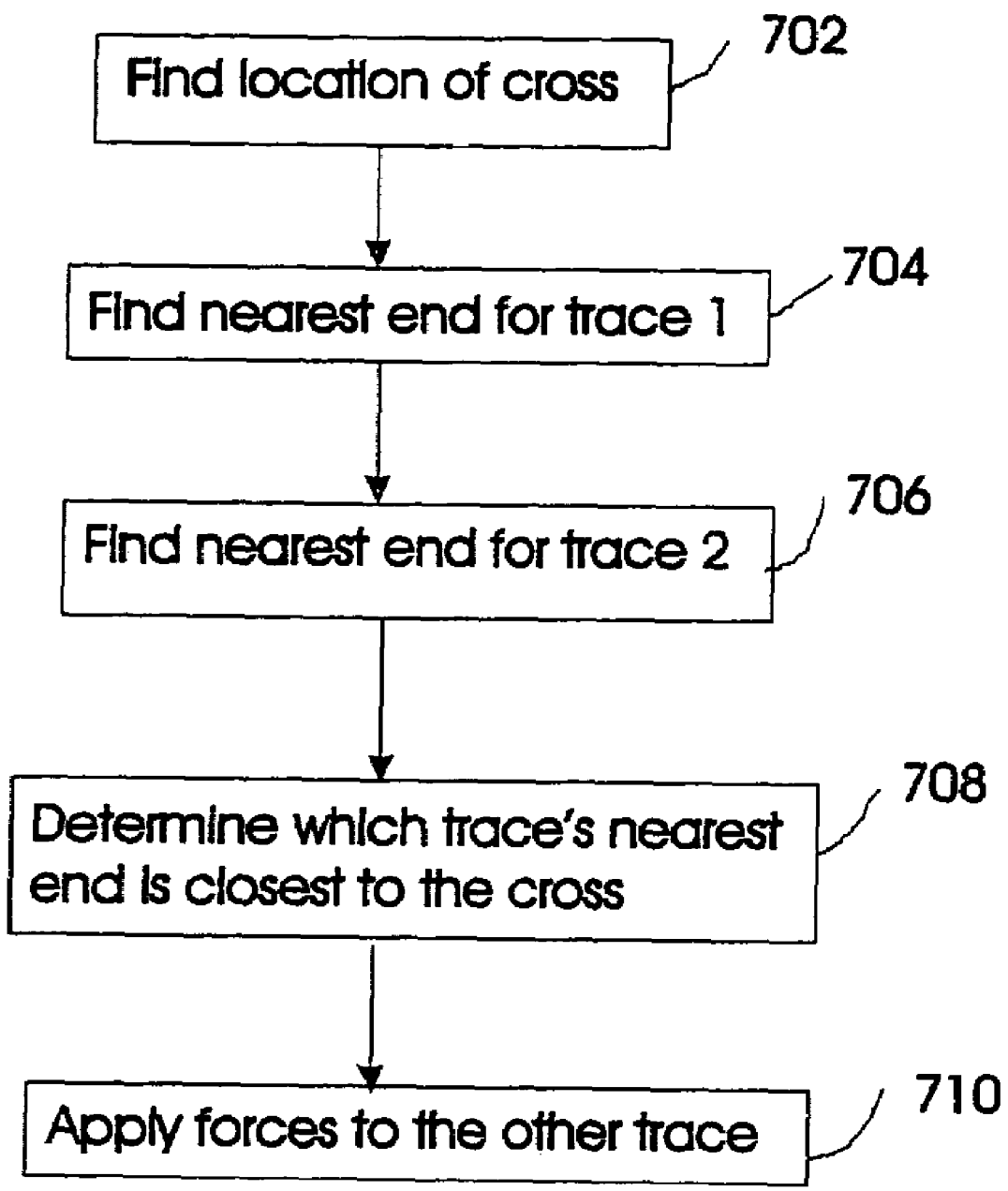
FIG. 7 illustrates an exemplary process for applying forces to nodes of crossed traces.
Figure 8A:
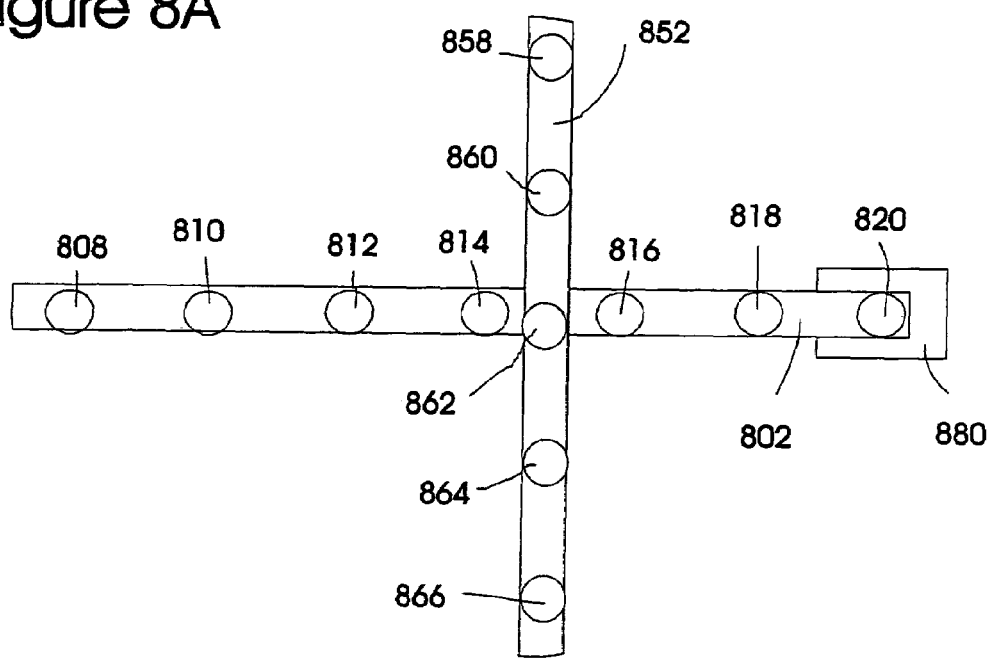
FIGS. 8A-8C illustrate application of the process of FIG. 7 to exemplary traces.
Figure 8B:
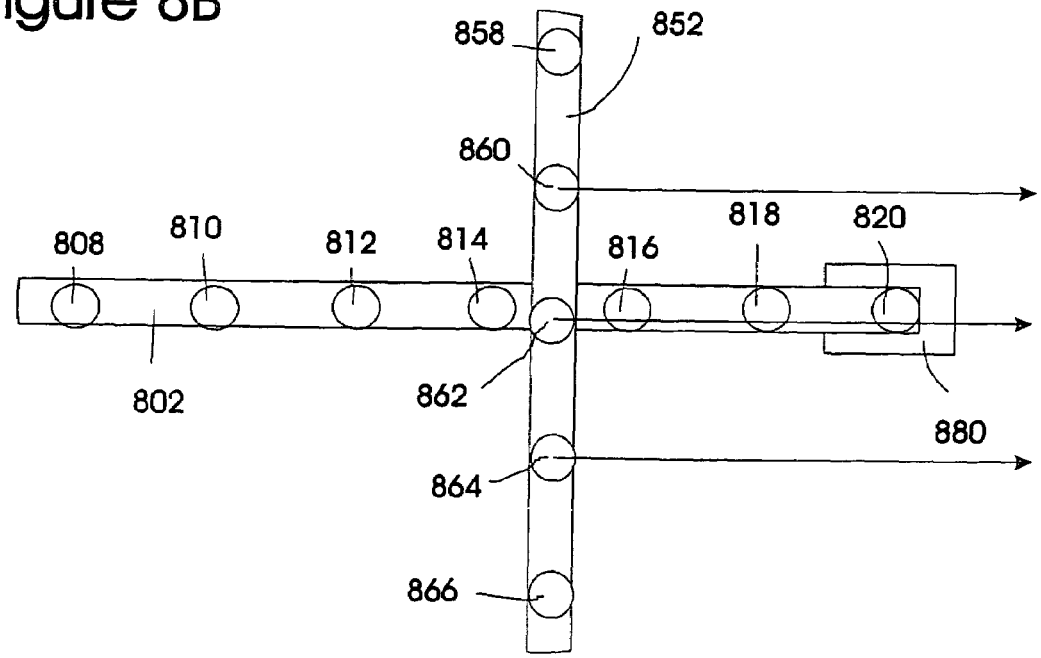
Figure 8C:
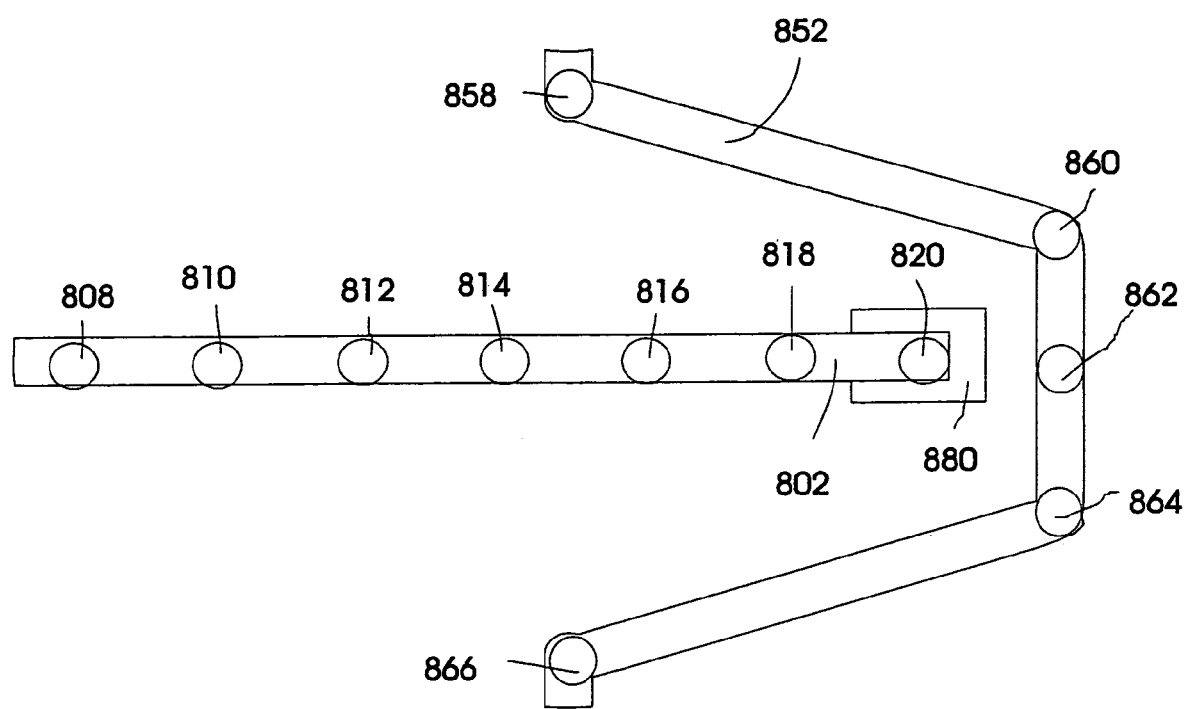

FIG. 7 illustrates still another exemplary way of assigning forces to the nodes of a trace (step 206 of FIG. 2). In this example, nodes in two traces that cross are assigned forces that tend to uncross the traces. FIGS. 8A-8C illustrate an exemplary application of the process illustrated in FIG. 7.

As shown in FIG. 7, the location within the routing space at which the two traces cross is located 702. At steps 704, 706, and 708, it is determined which of the two traces has an end that is nearest the point at which the traces cross. At step 710, forces are applied to the nodes of the other trace that tend to push the other trace toward and eventually past the end point of the trace whose end is nearest the crossing point. Operation of this process is illustrated in FIGS. 8A-8C.

As shown in FIG. 8A, traces 802 and 852 cross. As can be seen, trace 802 is the trace with an end 820 (at component 880) that is nearest the crossing point of the traces. Accordingly, forces are applied to nodes of trace 852 that are within a threshold distance of the crossing point (here 860, 862, and 864) that tend to push these nodes toward the end point 820 of trace 802. The numerical value of the threshold is not critical to the invention, but a distance on either side of the point of crossing that represents at least the minimum trace-to-trace clearance is suitable. Alternatively, forces may be applied to a specified number of nodes of trace 852 on either side of the crossing (e.g., two or three nodes on either side of the crossing).

As shown in FIG. 8C, if the process is repeated enough times, a portion of trace 852 should be pushed beyond the end point 820 of trace 802. The magnitude of the forces represents a trade off between fast and precise results. Generally speaking, the greater the magnitude of the force (and thus the greater the distance each application of the force pushes the nodes), the faster the traces will uncross. Again generally speaking, however, the greater the magnitude of the force, the more likely it is that the nodes will overshoot an optimal uncrossed position. A magnitude for the type of force that tends to uncross traces (e.g., the type of force illustrated in FIGS. 7-8C) selected from the following range is suitable: a magnitude that would cause a node to move (if the force acts by itself) a distance selected from between about ¼ to about ½ the sum of the maximum trace width plus the minimum trace-to-trace clearance. The instant invention, however, is not limited to use of a force magnitude selected from the foregoing range. As another alternative, the force may vary (e.g., increase) with time as execution of the process of FIG. 2 proceeds.

Of course, forces may be applied to nodes of crossed traces in accordance to processes other than the one illustrated in FIGS. 7-8C. FIGS. 7-8C are examples only.

Several ways of assigning forces to the nodes of a trace or traces have been described above, including applying forces that tend to shorten, straighten, and smooth a trace as illustrated in FIGS. 3A-3F, forces that tend to push traces away from obstacles as illustrated in FIGS. 4A-5E, forces that tend to push two nearby traces apart as illustrated in FIGS. 6A-6D, and forces that tend to uncross crossed traces as illustrated in FIGS. 7-8C. It should be understood that these are nonexclusive examples of the types of forces that may be applied to the nodes of the traces at step 206 of FIG. 2. It should also be understood that any one or more of the above described types of forces may be applied to the trace nodes at step 206.

Figure 9A:
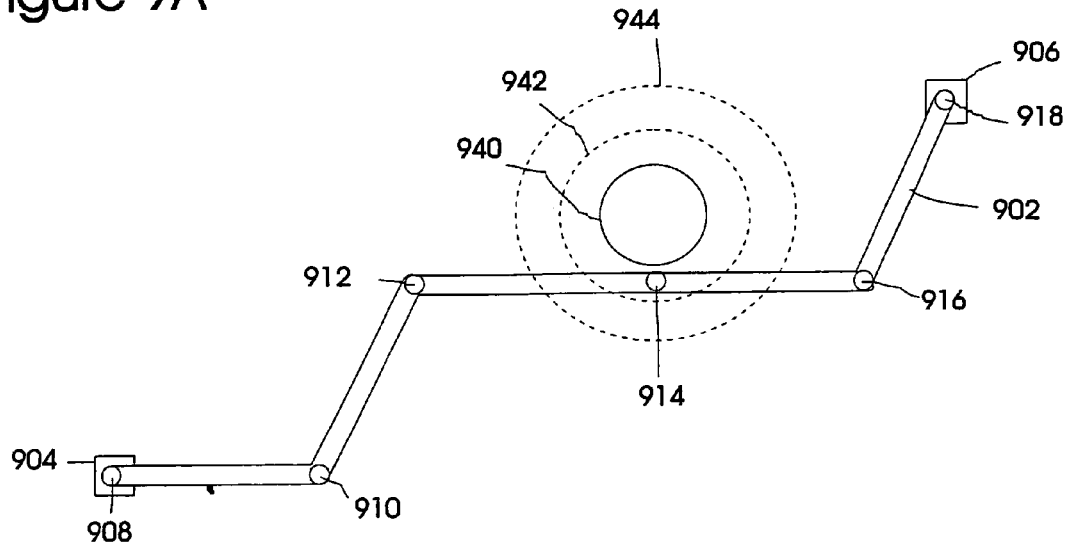
FIGS. 9A-9F illustrate exemplary application of forces to nodes of a trace.

FIGS. 9A-9F illustrate an example in which two different types of forces are applied to the nodes of a trace: forces that tend to shorten, straighten, and/or smooth the trace, and forces that tend to push the trace away from obstacles. As shown in FIG. 9A, trace 902 electrically connects components 904 and 906. The trace 902 comprises interconnected nodes 908, 910, 912, 914, 916, and 918. Obstacle 940 includes a first zone 942 to which is assigned a relatively strong force and a second zone 944 to which is assigned a weaker force as discussed above with respect to FIGS. 4A-5E. In this example, the first zone 942 corresponds to the minimum trace-to-obstacle clearance received at step 202 of FIG. 2.

Figure 9B:
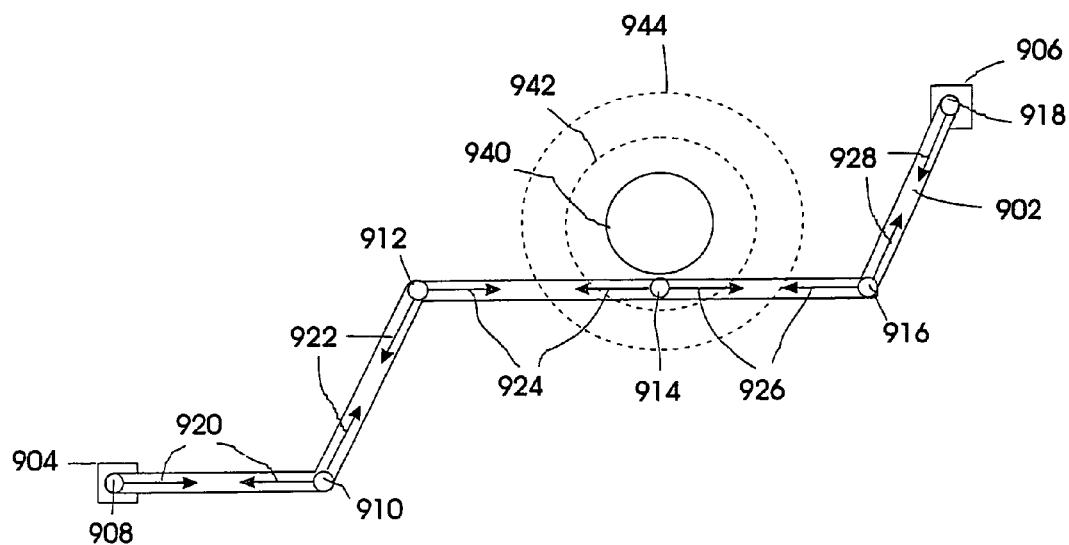

As shown in FIG. 9B, forces attracting sequential pairs of nodes are assigned to each node as per the discussion above with respect to FIGS. 3B-3D. That is, forces 920 are applied to node pair 908 and 910; forces 922 are applied to node pair 910 and 912; forces 924 are applied to node pair 912 and 914; forces 926 are applied to node pair 914 and 916; and forces 928 are applied to node pair 916 and 918. As shown in FIG. 9B, these forces tend to push the node pairs together.

Figure 9C:
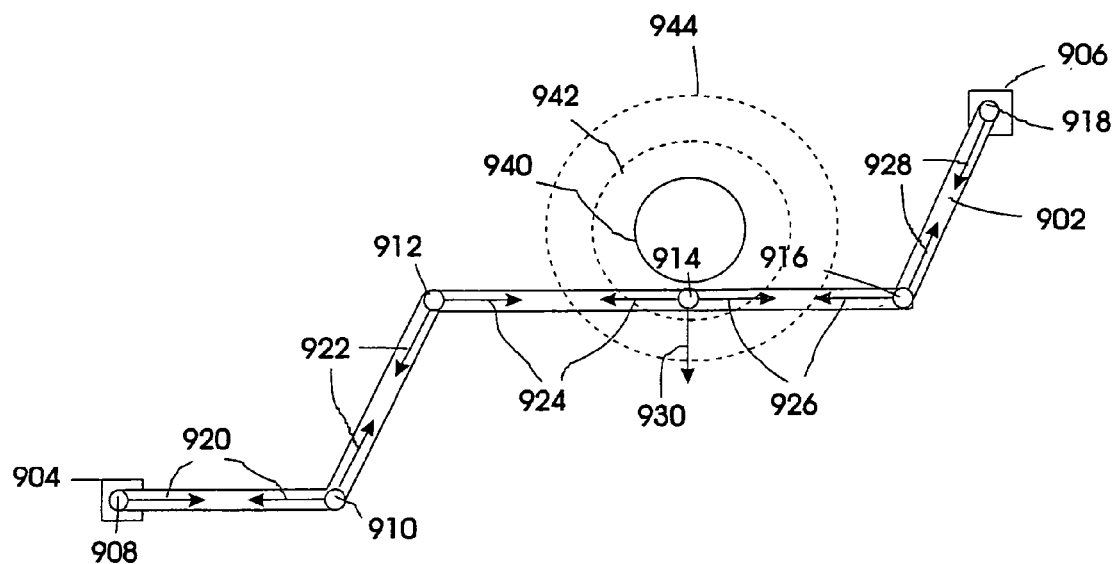

As shown in FIG. 9A, only one of the nodes falls within either of the zones 942 and 944 surrounding obstacle 940, and that node—node 914—falls within the first zone 942. As shown in FIG. 9C, a force 930 associated with the first zone 942 is applied to node 914. In this example, the magnitude of the force 930 is greater than the forces 920, 922, 924, 926, 928. All of this may be done as per the discussion above with respect to FIGS. 4A-5E.

Figure 9D:
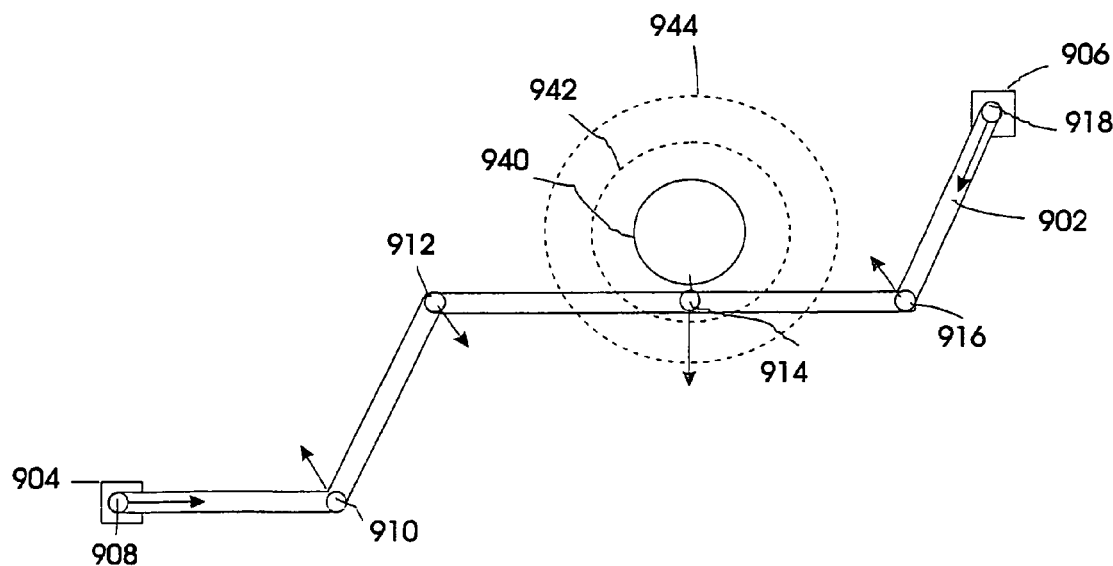
Figure 9E:
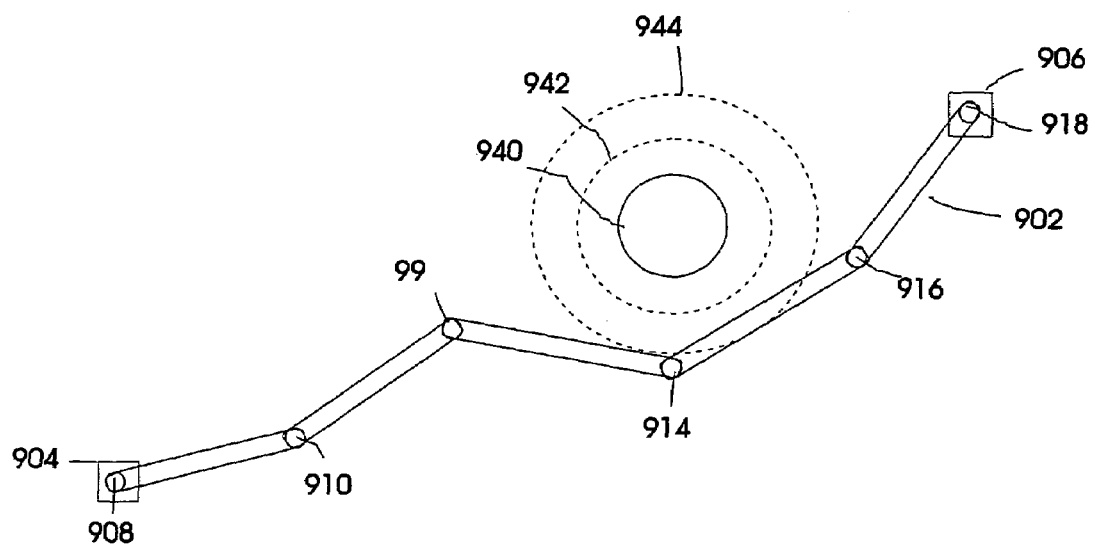
Figure 9F:
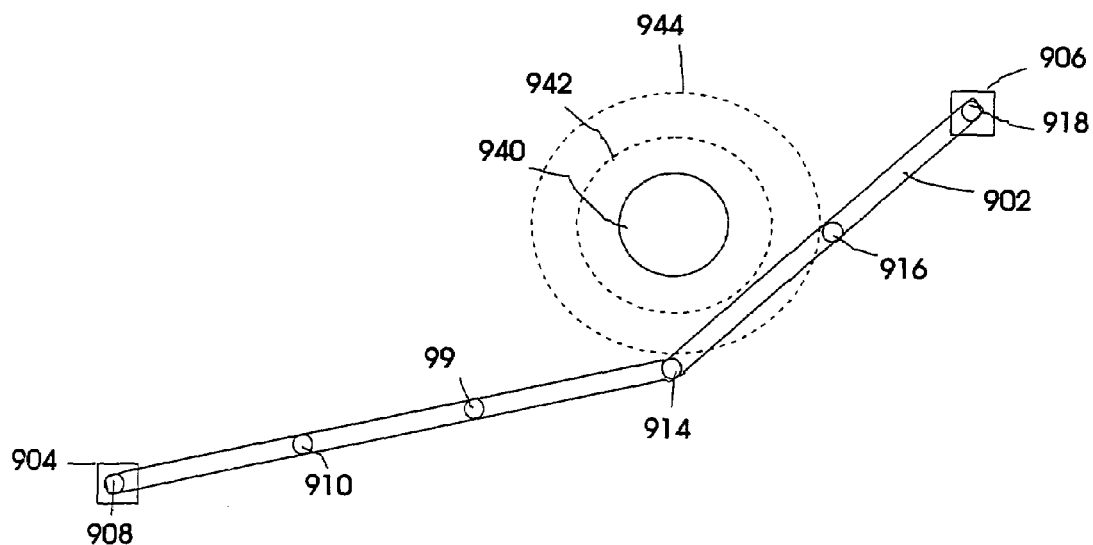

FIG. 9D illustrates the resultant sum of the forces on each node. As shown in FIG. 9E (and in accordance with step 208 of FIG. 2), the nodes are then moved in accordance with the forces. Because nodes 908 and 918 are end nodes, they are not moved regardless of the forces applied to them. Nodes 910, 912, 914, and 916, however, are moved as shown in FIG. 9E. As also shown in FIG. 9E, this tends to smooth, straighten, and or shorten the trace 902 as well as enforce design rules. Repeated application of steps 204, 206, and 208 of FIG. 2 should tend to produce a trace path that is similar to the trace path shown in FIG. 9F.

Although 9A-9F illustrate application of only two types of forces—forces tending to attract adjacent nodes of the same trace, and forces tending to move a trace away from an obstacle—the step 206 of assigning new forces to trace nodes may include application of all of the exemplary types of forces described above in FIGS. 3A-8C, as well as other types of forces.

If all of the different types of forces illustrated in FIGS. 3A-8C are applied at step 206 of FIG. 2, then, in a preferred but exemplary embodiment, the magnitudes of the different forces is preferably as follows, in which "s" equals the sum of the maximum trace width plus the minimum trace-to-trace clearance, as received at step 202 of FIG. 2: the magnitude of the forces tending to attract adjacent nodes of the same trace (e.g., as described above with respect to FIGS. 3A-F) is about s/10; the magnitude of forces tending to push nodes away from an obstacle where the nodes fall within a first zone around the obstacle (e.g., as described above with respect to FIGS. 4A-5E) is about s/4; the magnitude of forces tending to push nodes away from an obstacle where the nodes fall within a second zone around the obstacle (e.g., as described above with respect to FIGS. 4A-5E) is about s/15; the magnitude of forces tending to push two traces apart (e.g., as described above with respect to FIGS. 6A-6D) is about s/4; and the magnitude of forces tending to uncross traces (e.g., as described above with respect to FIGS. 7-8C) is about s/2 to s. Moreover, in a preferred embodiment, all of the above described forces are increased over time as the process of FIG. 2 executes except the forces tending to attract adjacent nodes of the same trace (e.g., as described above with respect to FIGS. 3A-F), which are kept approximately constant. In addition, in a preferred embodiment, movement of any given node at step 208 of FIG. 2 is limited to a maximum distance of about s/8, and this maximum distance is decreased over time as the process executes. Of course the foregoing is exemplary only; the invention is not so limited.

Figure 10:
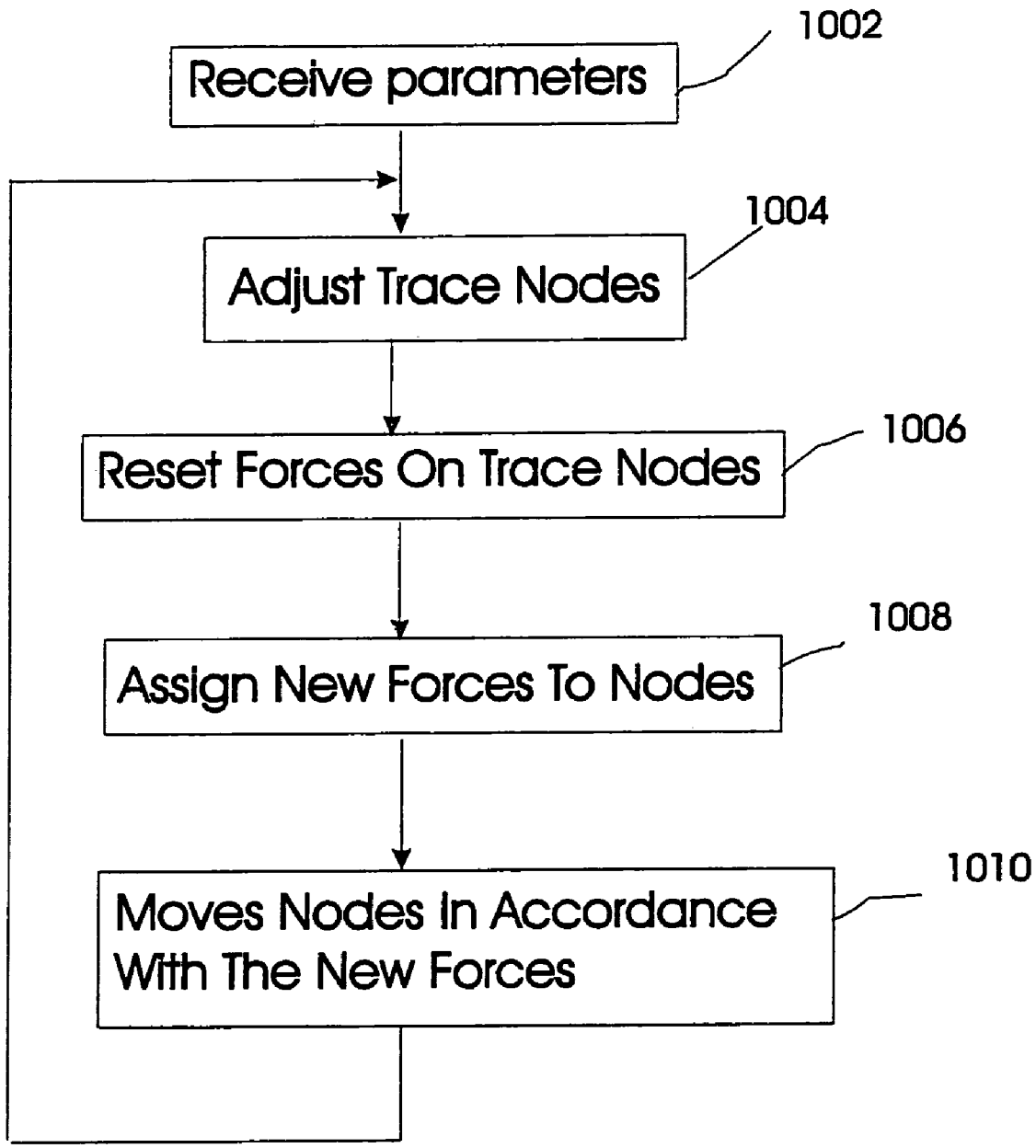
FIG. 10 illustrates an exemplary modification to the process of FIG. 2.

FIG. 10 illustrates an exemplary variation of the process of FIG. 2. Steps 1002, 1006, 1008, and 1010 may be similar or identical to steps 202, 204, 206, and 208, respectively, of FIG. 2. Step 1004, however, is unique to FIG. 10. In step 1004, the process of FIG. 10 attempts to adjust the nodes in the traces to improve processing of the traces.

One example of adjusting the nodes in a trace involves attempting to make the node pattern in a trace or some aspect of the node pattern more uniform. There are many ways in which this could be done.

One exemplary way of attempting to make the node pattern more uniform is to add new nodes between preexisting node pairs in a trace if the gap between the preexisting node pairs exceeds a threshold. Use of a particular threshold value is not critical to the invention, and any threshold may be used. Generally speaking, selection of a threshold represents a trade off between fast execution and precise results. Again generally speaking, the smaller the threshold, the more precise the results; the greater the threshold, the faster the execution time. A threshold that is about ⅔ the sum of the maximum trace width plus the minimum trace-to-trace clearance has been found to be suitable, although the invention is not limited to use of this or any other specific threshold value. It may also be beneficial to decrease the threshold in some sort of proportion to the number and/or size of obstacles in a particular area. For example, in a preferred embodiment, the threshold in areas with small obstacles may be less than areas with large obstacles The threshold or thresholds also may be decreased over time as execution of the process of FIG. 10 proceeds.

Figure 11A:
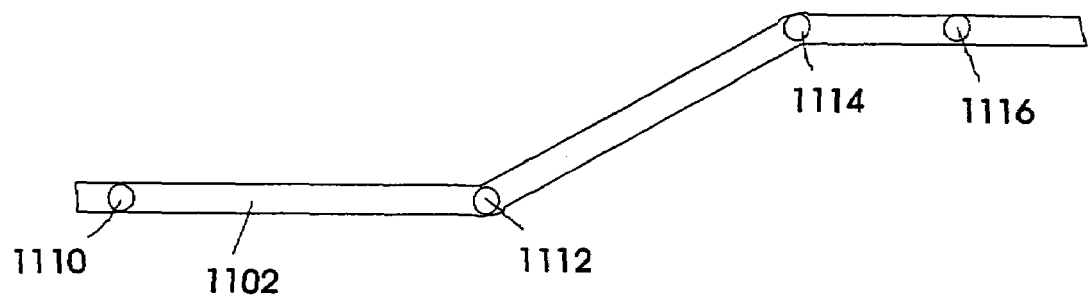
FIGS. 11A-11D illustrate exemplary adjustment of nodes of a trace.
Figure 11B:
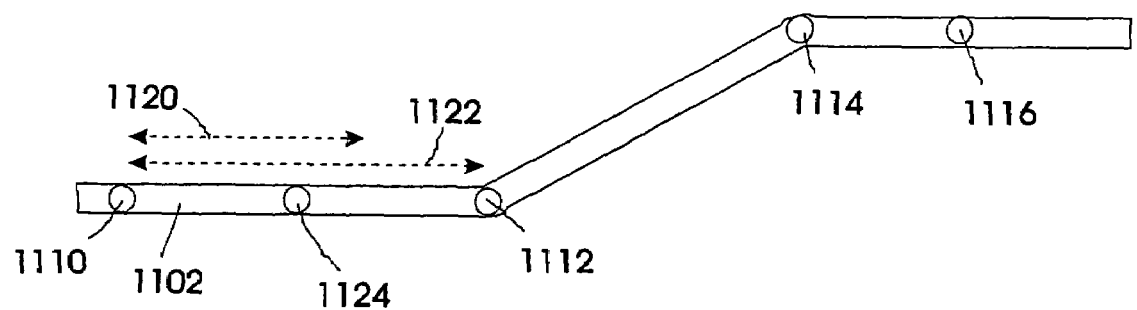
Figure 11C:
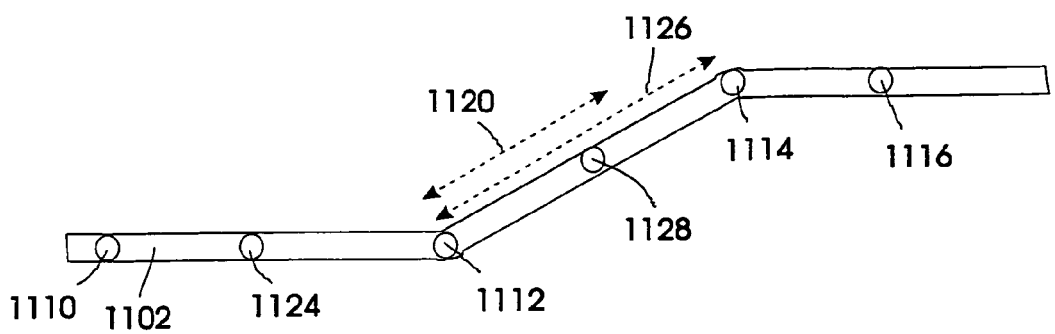
Figure 11D:
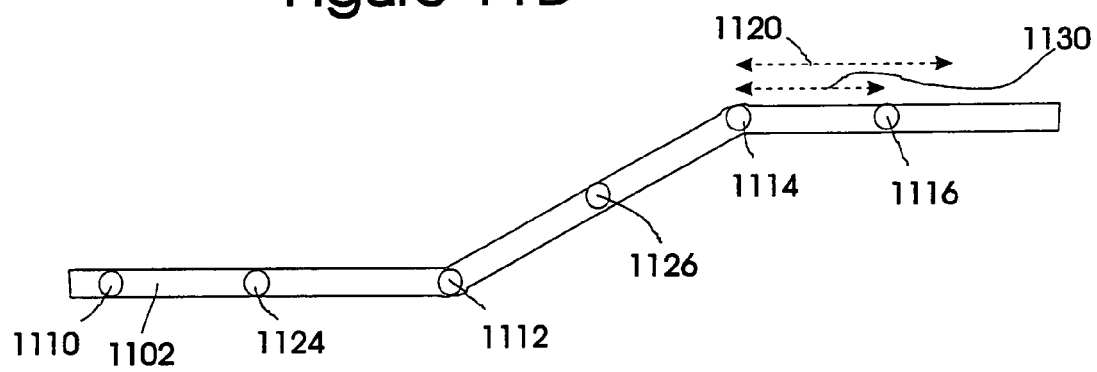

FIGS. 11A-11D illustrate an example of adjusting nodes of an exemplary trace in accordance with step 1004 of FIG. 10. A portion of a trace 1102 comprising nodes 1110, 1112, 1114, and 1116 is shown in FIG. 11A. In this example, a trace node is to be added between adjacent node pairs that are separated by more than a threshold distance 1120. As shown in FIG. 11B, adjacent node pairs 1110 and 1112 are separated by a distance 1122 that is greater than the threshold 1120. Consequently, new node 1124 is added between nodes 1110 and 1112. As shown in FIG. 11C, node pairs 1112 and 1114 are also separated by a distance 1126 that is greater than the threshold 1120. Therefore, new node 1128 is added between nodes 1112 and 1114. As shown in FIG. 11D, the distance 1130 between adjacent nodes 1114 and 1116 is less than the threshold 1120. Accordingly, no new node is added between nodes 1114 and 1116.

Another exemplary way to adjust the nodes in an attempt to make the node pattern in a trace more uniform is to remove nodes that are spaced closer than a threshold distance. This threshold should be, of course, less than the threshold discussed above for determining when to add additional nodes. Of course, one could both add nodes between adjacent nodes that are spaced farther apart than a first threshold distance and delete nodes that are spaced closer than a second threshold distance to adjust the nodes in a trace in accordance with step 1004 of FIG. 10.

Another way of adjusting nodes in a trace in accordance with step 1004 of FIG. 10 is to remove all of the nodes in a straight section of a trace, leaving only the nodes that define the beginning of a curved portion of the trace on either side of the straight section.

Yet another example of adjusting the nodes in a trace involves searching for consecutive nodes in a trace to which no force involving a design rule violation has been assigned. Examples of forces involving design rule violations include forces assigned to nodes that are closer to an obstacle than the minimum required trace-to-obstacle clearance. Another example of a force that involves a design rule violation is a force designed to separate two traces that are closer together than the minimum required trace-to-trace clearance. Where no force involving a design rule violation has been assigned to three or more consecutive nodes in the same trace, the middle nodes (i.e., the nodes between the outer two of the three or more consecutive nodes) may be arranged in, or forces applied to move toward, a straight line between the outer two of the consecutive nodes.

For example, because none of the nodes in the exemplary trace illustrated in FIG. 3D has been assigned a force that arises from a design rule violation, the nodes 310, 312, 314, and 316 could simply be arranged in a straight line between outer nodes 308 and 318. As another example, the exemplary trace 902 illustrated in FIG. 9D includes three consecutive nodes 908, 910, and 912 to which no force arising from a design rule violation was assigned. Consequently, node 910 could simply be aligned to form a straight line with nodes 908 and 912, quickly straightening the portion of the trace between nodes 908 and 912. Note that node 914 includes force 930 that arises from a design rule violation—namely, the force 930 applied to node 914 arises because node 914 is closer to obstacle 940 than the minimum obstacle-to-trace clearance.

As suggested by the looping arrow in FIG. 10, it may be advantageous to repeat the process of FIG. 10 one or more times. As with FIG. 2, those of ordinary skill in the field will readily recognize the need to include provisions within the process illustrated in FIG. 10 to control the number of times the process is repeated. Moreover, FIG. 10 may be modified such that the steps of resetting forces on trace nodes 1006, assigning new forces to the nodes 1008, and moving the nodes in accordance with the forces 1010 are themselves repeated one or more times before the step of adjusting the nodes in traces 1004 is repeated.

Referring generally to all of the figures, in the above described exemplary embodiments of the invention, each node is moved a distance that corresponds to the sum of the forces acting on the node. Alternatively, a limit may be placed on the distance a node is moved at any one time by the sum of the forces acting on it. For example, a limit selected from the range ¼ to ¹⁄₁₆ the sum of the maximum trace width plus the minimum trace-to-trace clearance may be placed on movement of a node at any one time. (The foregoing numerical values, however, are exemplary only, and the invention is not limited to such numerical values.) Alternatively, the limit placed on movement of a node at any one time may be changed over time as the process executes. For example, the limit may be decreased over time.

In addition, it may be advantageous to place other limits on movement of the nodes. For example, it may be preferred that a node not be allowed to move out of the routing space. Also, some nodes may be designated is not moveable, in which case they are not moved regardless of any forces applied to them. For example nodes associated with the beginning point or end point of a trace may be designated as not moveable. As another example, for whatever reason, a node may be flagged as not moveable, in which case it is not moved regardless of forces assigned to it.

It should be noted that, if for whatever reason, it is not possible to find a legal route (e.g., a route that does not violate design rules or a route that does not cross another trace), an additional layer or layers may be added to the routing space of the electronics system. Thus, a three dimensional routing space may be used, with multiple layers of routing spaces available, each of which may contain traces. With an insulating material between each layer, traces on one layer may cross traces on another layer. Alternatively, or in addition, traces that cannot be routed satisfactorily may simply be flagged, and other means used to route the traces, or the design of the electronics system be altered to improve routing.

It should also be noted that the routing space may be divided into a plurality of areas in which a particular set of design rules and/or other parameters apply in one area of the routing space and a different set of design rules and/or other parameters apply in another area of the routing space. In such a case, the parameters received at step 202 of FIG. 2, would include not only a description (e.g., the location, size, shape, and/or perimeter, etc.) of the routing space but a description of the various areas as well. The parameters would also include a different set of design rules for each such area within the routing space. The above described processes would be modified to determine which area a particular action relates to and then apply the particular design rules that correspond to the action. For example, in applying forces to a particular node, the area in which the node falls may first be determined, and then a particular magnitude force or forces may be selected in accordance with the design rules or other parameters associated with the area. As another example, the size of the first and second zones around an obstacle, such as the zones illustrates in FIGS. 4A-5E may be different depending on which area the obstacle is located in. Indeed, if the obstacle falls within two areas, the size of the zones may be different on different sides or portions of the obstacle in accordance with the different areas the obstacles overlays.

It should be apparent that the above described embodiments of the invention and variations of the such embodiments may be implemented in software operating on a general or special purpose computer. Alternatively, the embodiments and variations may be implemented in specially designed hardware or a combination of software and special purpose hardware.

Although the principles of the present invention have been illustrated and explained in the context of specific embodiments, it will be appreciated by those having skill in the art that various modifications beyond those illustrated can be made to the disclosed embodiments without departing from the principles of the present invention. For example, the electrically conductive traces described above could instead be microwave guides in a microwave system. Indeed, the instant invention could be used to adjust computer-generated paths between points in any system that can be modeled as a system through which paths need to be routed. For example, the instant invention could be used to adjust computer generated paths representing roads, aqueducts, plumbing, pathways, etc. in traffic systems, water distribution systems, buildings, etc. Such modifications to and departures from the disclosed embodiments are deemed to be within the scope of the following claims.

What is claimed is:

1. A computer for use in determining locations of traces in a physical layout comprising a processor:

means for receiving information representing a proposed physical layout of a routing space in an electronics system including obstacle locations and end points of traces, each trace defined by a set of sequential nodes;

means for assigning forces to ones of said sequential nodes defining a selected trace between a first one of said end points and a second one of said end points in said proposed physical layout; and means for adjusting in said proposed physical layout said location of selected ones of said nodes in accordance with said forces resulting in at least one of:

reducing a physical length of said selected trace between said first end point and second end point in said proposed physical layout, or moving at least part of said selected trace away from one of said obstacle locations in said proposed physical layout.

2. The computer of claim 1, wherein:
each said force comprises a direction and a magnitude, and
said means for adjusting moves each said node in said proposed physical layout in said direction of said force assigned to said node a distance that corresponds to said magnitude of said force assigned to said node.

3. The computer of claim 1, wherein:
said means for assigning assigns a plurality of forces to each of said ones of said nodes; and
said means for adjusting moves each said node in said proposed physical layout in accordance with a sum of said plurality of forces assigned to said node.

4. The computer of claim 1, wherein said means for assigning identifies sequential pairs of said nodes, and for each said identified pair of nodes, assigns a force to each node in said pair that tends to move said node towards said other node in said pair in said proposed physical layout.

5. The computer of claim 1, wherein said means for assigning assigns a force to each of said nodes that is disposed within a predetermined distance of an obstacle location through which said selected trace is not allowed to pass.

6. The computer of claim 1, wherein said means for assigning assigns a force to each of said nodes that is disposed within a predetermined distance of a node that defines a second trace.

7. The computer of claim 1, wherein said assigned forces comprise vectors with a direction and magnitude that tend to move in said proposed physical layout at least a portion of said selected trace away from an obstacle location in said proposed physical layout through which said selected trace is not allowed to pass.

8. The computer of claim 1, wherein said assigned forces comprise vectors with a direction and magnitude that tend to move in said proposed physical layout at least a portion of said selected trace away from another second trace in said proposed physical layout.

9. The computer of claim 1, wherein said means for assigning repeats said assigning of forces and said means for adjusting repeats said adjusting of nodes at least until said at least part of said selected trace is moved in said proposed physical layout at least a predetermined distance from said obstacle location in said proposed physical layout.

10. The computer of claim 9, wherein said selected trace represents a first conductor that electrically connects a first electronic element and a second electronic element in said electronics system.

11. A computer for use in uncrossing a first trace and a second trace in a proposed physical layout of a routing space in an electronics system, wherein said first trace is defined by a plurality of first sequential nodes in said proposed physical layout and said second trace is defined by a plurality of second sequential nodes in said proposed physical layout, said computer comprising a processor:
means for receiving information representing said proposed physical layout;
means for determining from said proposed physical layout which one of said first trace and said second trace has a nearest end to a crossing of said first trace and said second trace, and selecting the other trace;
means for assigning forces to ones of the nodes of said selected trace, wherein said forces tend to move said nodes towards said nearest end; and
means for adjusting in said proposed physical layout said ones of said nodes in accordance with said forces.

12. The computer of claim 11, wherein said ones of said nodes to which said forces are assigned are nodes that are within a threshold distance of said crossing of said first trace and said second trace.

13. The computer of claim 11, wherein said ones of said nodes to which said forces are assigned are a predetermined number of nodes on either side of said crossing of said first trace and said second trace.

14. The computer of claim 11, wherein the forces are repeatedly assigned and said ones of said nodes are repeatedly moved until said first trace and said second trace are uncrossed.

15. The computer of 14, wherein:
said first trace represents a first conductor that electrically connects a first electronic element and a second electronic element in said electronics system: and
said second trace represents a second conductor that electrically connects a third electronic element and a fourth electronic element in said electronics system.

16. A computer-readable storage medium comprising software for adjusting a trace defined by sequential nodes in a proposed physical layout of a routing space in an electronics system, said trace being between first and second end points, said method comprising:
receiving information defining said proposed physical layout including said sequential nodes and obstacle locations;
assigning forces to ones of said nodes; and
moving within said proposed physical layout of locations of selected ones of said nodes in accordance with said forces resulting in at least one of:
reducing a physical length of said trace between said first end point and said second end point in said proposed physical layout, or
moving at least part of said trace away from an obstacle location in said proposed physical layout.

17. The media medium of claim 16, wherein:
each said force comprises a direction and a magnitude, and
said moving comprises moving each said node in said proposed physical layout in said direction of said force assigned to said node a distance that corresponds to said magnitude of said force assigned to said node.

18. The medium of claim 16, wherein:
said assigning comprises assigning a plurality of forces to each of said ones of said nodes; and
said moving comprises moving each said node in said proposed physical layout in accordance with a sum of said plurality of forces assigned to said node.

19. The medium of claim 16, wherein said assigning comprises:
identifying sequential pairs of said nodes; and
for each said identified pair of nodes, assigning a force to each node in said pair that tends to move said node in said proposed physical layout towards said other node in said pair.

20. The medium of claim 16, wherein said assigning comprises assigning a force to each of said nodes that is disposed within a predetermined distance of an obstacle location through which said trace is not allowed to pass.

21. The medium of claim 16, wherein said assigning comprises assigning a force to each of said nodes that is disposed within a predetermined distance of a node that defines a second trace.

22. The medium of claim 16, wherein said assigned forces comprise vectors with a direction and magnitude that tends to move in said proposed physical layout at least a portion of said trace away from an obstacle location in said proposed physical layout through which said trace is not allowed to pass.

23. The medium of claim 16, wherein said assigned forces comprise vectors with a direction and magnitude that tends to move in said proposed physical layout at least a portion of said trace away from another second trace in said proposed physical layout.

24. The medium of claim 16 further comprising repeating said assigning and said moving until said at least part of said trace is moved in said proposed physical layout at least a predetermined distance from said obstacle location in said proposed physical layout.

25. The medium of claim 24, wherein said trace represents a first conductor that electrically connects a first electronic element and a second electronic element in said electronics system.

26. A computer-readable storage medium comprising software for uncrossing a first trace and a second trace in a proposed physical layout of a routing space of an electronics system, wherein said first trace is defined by a plurality of first sequential nodes in said proposed physical layout and said second trace is defined by a plurality of second sequential nodes in said proposed physical layout, said method comprising:

receiving information representing said proposed physical layout;

determining from said proposed physical layout which of said first trace and said second trace has a nearest end to a crossing of said first trace and said second trace, and selecting the other trace;

assigning forces to ones of the nodes of said selected trace, wherein said forces tend to move said nodes towards said nearest end; and moving said ones of said nodes within said proposed physical layout in accordance with said forces.

27. The medium of claim 26, wherein said ones of said nodes to which said forces are assigned are nodes that are within a threshold distance of said crossing of said first trace and said second trace.

28. The medium of claim 26, wherein said ones of said nodes to which said forces are assigned are a predetermined number of nodes on either side of said crossing of said first trace and said second trace.

29. The medium of claim 26, further comprising repeating said assigning and said moving until said first trace and said second trace are uncrossed.

30. The medium of 29, wherein:

said first trace represents a first conductor that electrically connects a first electronic element and a second electronic element in said electronics system: and said second trace represents a second conductor that electrically connects a third electronic element and a fourth electronic element in said electronics system.

\* \* \* \* \*